(12) United States Patent
Ho et al.

(10) Patent No.: US 9,685,354 B2
(45) Date of Patent: Jun. 20, 2017

(54) SEPARATION APPARATUS AND A METHOD FOR SEPARATING A CAP LAYER FROM A CHIP PACKAGE BY MEANS OF THE SEPARATION APPARATUS

(71) Applicant: XINTEC INC., Taoyuan (TW)

(72) Inventors: Yen-Shih Ho, Kaohsiung (TW); Tsang-Yu Liu, Zhubei (TW); Chia-Sheng Lin, Taoyuan (TW); Yi-Ming Chang, Taoyuan (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/676,478

(22) Filed: Apr. 1, 2015

(65) Prior Publication Data

US 2015/0287619 A1    Oct. 8, 2015

(30) Foreign Application Priority Data

Apr. 3, 2014 (TW) .............................. 103112450 A
Jan. 27, 2015 (TW) .............................. 104102651 A
Jan. 27, 2015 (TW) .............................. 104201265 A

(51) Int. Cl.
*B26D 1/09* (2006.01)
*H01L 21/67* (2006.01)
(Continued)

(52) U.S. Cl.
CPC ........ *H01L 21/67092* (2013.01); *B26D 1/095* (2013.01); *B26D 7/1863* (2013.01);
(Continued)

(58) Field of Classification Search
CPC ........... H01L 21/67092; H01L 21/6838; Y10T 83/0267
See application file for complete search history.

(56) References Cited

U.S. PATENT DOCUMENTS 6,279,225 B1 * 8/2001 Martin ............... H05K 13/0404
29/740
7,665,783 B2 * 2/2010 Nishio .................. B25B 11/005
294/188

FOREIGN PATENT DOCUMENTS

CN          202025729        * 11/2011

* cited by examiner

*Primary Examiner* — Richard Booth
(74) *Attorney, Agent, or Firm* — Liu & Liu

(57) ABSTRACT

An embodiment of this invention provides a separation apparatus for separating a stacked article, such as a semiconductor chip package with sensing functions, comprising a substrate and a cap layer formed on the substrate. The separation apparatus comprises a vacuum nozzle head including a suction pad having a top surface and a bottom surface, a through hole penetrating the top surface and the bottom surface of the suction pad, and a hollow vacuum pipe connecting the through hole to a vacuum pump; a stage positing under the vacuum nozzle head and substantially aligning with the suction pad; a control means coupling to the vacuum nozzle head to lift upward or lower down the vacuum nozzle head; and a first cutter comprising a first cutting body and a first knife connecting to the first cutting body. The cap layer is pressed against by the bottom surface of the suction pad and sucked by the suction pad of the vacuum nozzle head after the vacuum pump begins to vacuum the air within the hollow vacuum pipe and the through hole. Then, the first cutter cuts into the interface between the substrate and the cap layer, and the cap lay is separated from the substrate by the suction force of the vacuum nozzle head and the lift force generated by the upward movement of the vacuum nozzle head.

30 Claims, 28 Drawing Sheets

(51) Int. Cl.
*H01L 21/683* (2006.01)
*B26D 7/18* (2006.01)
(52) U.S. Cl.
CPC ....... *H01L 21/6838* (2013.01); *Y10T 83/0267* (2015.04); *Y10T 225/10* (2015.04); *Y10T 225/12* (2015.04); *Y10T 225/364* (2015.04)

SEPARATION APPARATUS AND A METHOD FOR SEPARATING A CAP LAYER FROM A CHIP PACKAGE BY MEANS OF THE SEPARATION APPARATUS

This application claims the benefit of Taiwan Application No. 103112450, filed on Apr. 3, 2014, and Taiwan Application No. 104102651, filed on Jan. 27, 2015, and Taiwan Application No. 104201265, filed on Jan. 27, 2015 the entirety of which are incorporated by reference herein.

BACKGROUND OF THE INVENTION

Field of the Invention

The present invention relates to a separation apparatus, and in particular relates to a separation apparatus for separate a cap layer from a chip package and a method for separating a cap layer from a chip package by means of the separation apparatus.

Description of the Related Art

The chip package process is an important process during the fabrication of an electronic product. Chip packages not only protect the chips therein from outer environmental contaminants, but also provide electrical connection paths between electronic elements inside and outside of the chip packages.

A conventional chip package having sensing functions, such as a fingerprint-recognition chip package, is easily contaminated or damaged during the manufacturing process and results in decreasing both the yield and liability of conventional chip package having sensing functions. In order to meet the tendency of size-miniaturization of electronic components, it is an import subject to minimize the thickness of a substrate for carrying a semiconductor chip to be packaged. However, if a thin substrate for carrying a semiconductor chip to be packaged is utilized, the yield will be reduced owing to the thin substrate is bended or damaged during the package process.

In order to resolved above-mentioned drawbacks, a so-called small leadless package technology (SLP) was disclosed. The SLP is characterized by adjoined a reinforced plate (cap layer) on the bottom side of the thin substrate carrying a semiconductor chip to be packaged on the top side to overcome the drawbacks of the substrate bended or damaged during the package process. The reinforced plate (cap layer) will be removed by separating it from the substrate after the thin substrate is molded. However, the bonding force between the thin substrate and the semiconductor chip is very strong, the wires on the thin substrate might be easily damaged during the step of separating the reinforce plate (cap layer) from the thin substrate.

Therefore, a new method for separating the reinforced plate (cap layer) from a SLP chip package without damaging the wires on the think substrate is desired.

SUMMARY OF THE INVENTION

An embodiment of this invention provides a separation apparatus for separating a stacked article, such as a semiconductor chip package with sensing functions, comprising a substrate and a cap layer formed on the substrate. The separation apparatus comprises a vacuum nozzle head including a suction pad having a top surface and a bottom surface, a through hole penetrating the top surface and the bottom surface of the suction pad, and a hollow vacuum pipe connecting the through hole to a vacuum pump; a stage positing under the vacuum nozzle head and substantially aligning with the suction pad; a control means coupling to the vacuum nozzle head to lift upward or lower down the vacuum nozzle head; and a first cutter comprising a first cutting body and a first knife connecting to the first cutting body. The cap layer is pressed against by the bottom surface of the suction pad and sucked by the suction pad of the vacuum nozzle head after the vacuum pump begins to vacuum the air within the hollow vacuum pipe and the through hole. Then, the first cutter cuts into the interface between the substrate and the cap layer, and the cap lay is separated from the substrate by the suction force of the vacuum nozzle head and the lift force generated by the upward movement of the vacuum nozzle head.

An embodiment of this invention provides another separation apparatus for separating a stacked article, such as a semiconductor chip package with sensing functions, comprising a substrate and a cap layer formed on the substrate. The separation apparatus comprises a vacuum nozzle head including a suction pad having a top surface and a bottom surface, an edge frame surrounding the edge of the bottom surface of the suction pad, a through hole penetrating the top surface and the bottom surface of the suction pad, and a hollow vacuum pipe connecting the through hole to a vacuum pump; a stage positing under the vacuum nozzle head and substantially aligning with the suction pad; a control means coupling to the vacuum nozzle head to screw and lift upward or lower down the vacuum nozzle head. The cap layer is pressed against by the bottom surface of the suction pad and the sidewalls of the stacked article are press against by the inner wall of the edge frame. The cap layer is sucked by the vacuum nozzle head after the vacuum pump begins to vacuum the air within the hollow vacuum pipe and the through hole, then the cap lay is separated from the substrate by the torque force generated by the screw of the nozzle head and the lift force generated by the upward movement of the vacuum nozzle head.

An embodiment of this invention provides a method for separating a cap layer from a chip package comprising: providing a separation apparatus for separating a cap layer from a chip package which includes a vacuum nozzle head with a suction pad having a top surface and a bottom surface, a through hole penetrating the top surface and the bottom surface of the suction pad, and a hollow vacuum pipe connecting the through hole to a vacuum pump, a stage positing under the vacuum nozzle head and substantially aligning with the suction pad, a control means coupling to the vacuum nozzle head to lift upward or lower down the vacuum nozzle head, and a first cutter comprising a first cutting body and a knife connecting to the first cutting body; providing a chip package on the stage, the chip package including a substrate having a first surface and a second surface opposite to each other, wherein a sensing device adjacent to the first surface and a wire interconnecting to the sensing device adjacent to the second surface, a cap layer capped on the substrate including a third surface having a bonding region with a surface area equal to that of the first surface and a peripheral region surrounding the bonding region and a fourth surface opposite to each other, wherein the cap layer is capped on the first surface of the substrate through the bonding region of the third surface; an adhesion layer overlying the sensing device sandwiched between the substrate and the cap layer, wherein the chip package further comprises a first sidewall, a second sidewall, a third sidewall and a fourth sidewall defined by the edges of the cap layer, the adhesion layer and the substrate, and the first sidewall opposites to the second sidewall, and the third sidewall opposites to the fourth sidewall; operating the control means to lower down the vacuum nozzle head to press against the fourth surface of the cap layer by the bottom surface of the suction pad; vacuuming the air within the hollow vacuum pipe and the through hole to suck the cap layer by the suction pad; moving the first cutter toward the first sidewall of the chip package to make the first knife cut into the adhesion layer along the third surface of the peripheral region near the first sidewall; and operating the control means to lift upward the vacuum nozzle head to separate the cap layer and the adhesion layer from the substrate of the chip package.

A embodiment of this invention provides another method for separating a cap layer from a chip package, comprising: providing a separation apparatus for separating a cap layer from a chip package which includes a vacuum nozzle head with a suction pad having a top surface and a bottom surface, a through hole penetrating the top surface and the bottom surface of the suction pad, and a hollow vacuum pipe connecting the through hole to a vacuum pump; a stage positing under the vacuum nozzle head and substantially aligning with the suction pad; a control means coupling to the vacuum nozzle head to lift upward or lower down the vacuum nozzle head, and a first cutter having a first cutting body and a first knife connecting to the first cutting body; providing a chip package on the stage, the chip package comprising a substrate including a first surface and a second surface opposite to each other, a sensing device adjacent to the first surface, and a wire interconnecting to the sensing device adjacent to the second surface; a cap layer including a third surface and a fourth surface opposite to each other capped on the first surface of the substrate through the third surface, an adhesion layer overlying the sensing device sandwiched between the substrate and the cap layer, wherein the chip package further comprising a first sidewall, a second sidewall, a third sidewall and a fourth sidewall defined by the edges of the cap layer, the adhesion layer and the substrate, and the first sidewall opposites to the second sidewall, and the third sidewall opposites to the fourth sidewall; operating the control means to lower down the vacuum nozzle head to press against the fourth surface of the cap layer by the bottom surface of the suction pad; vacuuming the air within the hollow vacuum pipe and the through hole to suck the cap layer by the suction pad; moving the first cutter toward the first sidewall of the chip package to make the first knife cut into the adhesion layer along the third surface of the cap layer near the first sidewall; and operating the control means to lift upward the vacuum nozzle head to separate the cap layer and the adhesion layer from the substrate of the chip package.

A embodiment of this invention provides another method for separating a cap layer from a chip package, comprising: providing a separation apparatus for separating a cap layer from a chip package with a vacuum nozzle head including a suction pad having a top surface and a bottom surface, a through hole penetrating the top surface and the bottom surface of the suction pad, and a hollow vacuum pipe connecting the through hole to a vacuum pump, a stage positing under the vacuum nozzle head and substantially aligning with the suction pad, a control means coupling to the vacuum nozzle head to screw and lift upward or lower down the vacuum nozzle head; providing a chip package on the stage, the chip package comprising a substrate including a first surface and a second surface opposite to each other, a sensing device adjacent to the first surface, and a wire interconnecting to the sensing device adjacent to the second surface; a cap layer including a third surface and a fourth surface opposite to each other capped on the first surface of the substrate through the third surface; an adhesion layer overlying the sensing device sandwiched between the substrate and the cap layer; operating the control means to lower down the vacuum nozzle head to press against the fourth surface of the cap layer by the bottom surface of the suction pad and press against the sidewall of the cap layer; vacuuming the air within the hollow vacuum pipe to achieve a vacuum degree Pi equal smaller than −90 Kpa to suck the cap layer by the suction pad; and operating the control means to screw the vacuum nozzle head at a speed of 300-700 degrees/second for a period of time less than 5 seconds to generate a torque force and lift upward the vacuum nozzle head to generate a lift force to separate the cap layer and the adhesion layer from the substrate of the chip package.

A detailed description is given in following embodiments with reference to the accompany drawings.

BRIEF DESCRIPTION OF THE DRAWINGS

The present invention can be more fully understood by reading the subsequent detailed description and examples with references made to the accompanying drawings, wherein

FIGS. 1A'~F' are cross-sectional views of a method for manufacturing a conventional chip package as shown in FIG. 1D.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A stacked chip package according to embodiments of the present invention may be used to package micro-electromechanical system chips. However, embodiments of the invention are not limited thereto. For example, the stacked chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 1A:
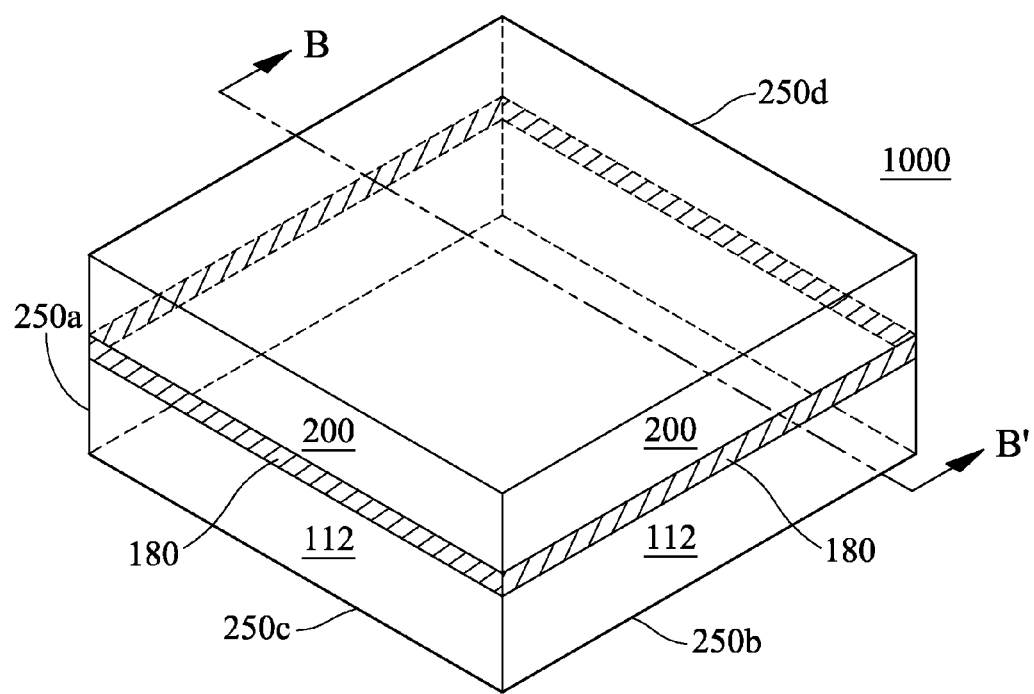
FIG. 1A is a perspective view of a conventional chip package.

Conventional Chip Package:

Referring to FIG. 1A, a perspective view of a conventional chip package 1000 is illustrated. As shown in FIG. 1A, the conventional chip package 1000 comprising a substrate 112, a cap layer 200 capped on the substrate 112, and an adhesion layer 180 sandwiched therebetween. The chip package 1000 further comprises a first sidewall 250a, a second sidewall 250b, a third sidewall 250c and a fourth sidewall 250d defined by the side edges of the cap layer 200, the adhesion layer 180 and the substrate 112, wherein the first sidewall 250a opposites to the second sidewall 250b, the third sidewall 250c opposites to the fourth sidewall 250d, and the first side wall 250a and the second sidewall 250b adjoin to both the third sidewall 250c and the fourth sidewall 250d. The cap layer 200 may comprise a material selected from one of the group consisting of glass, sapphire, aluminum nitride and a transparent tape or other suitable protection materials. The adhesion layer 180 may comprise light-sensitive resin s such as epoxy or UV glue, inorganic materials such as silicon oxide, silicon nitride, silicon oxynitride, metal oxide or combination thereof, organic polymers such as polyamide, benzocyclobutene, poly-p-xylene, naphthalene polymer, fluoro carbons, acrylate or other suitable adhesion materials.

Figure 1B:
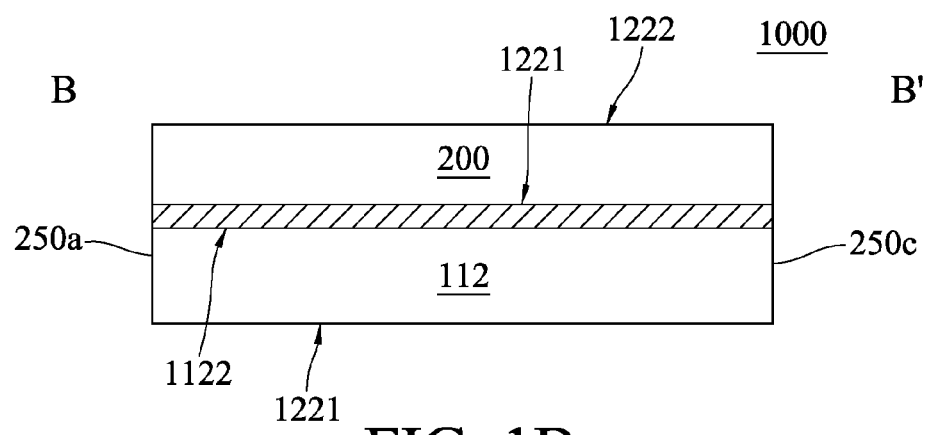
FIGS. 1B~1D are cross-sectional views of the conventional chip package shown in FIG. 1A.

Referring to FIG. 1B, a cross-sectional view of the of the conventional chip package 1000 shown in FIG. 1A is illustrated. As shown in FIG. 1B, the substrate 112 comprises a first surface 1122 and a second surface 1121 opposite to each other. The cap layer 200 capped on the substrate 112 includes a third surface 1221 facing the first face 1122 of the substrate 112 and a fourth surface 1222 opposite to the third surface 1221. In one embodiment, the chip package 1000 further comprises a print circuit board (not shown) bonded to the second surface 1121 of the substrate 112. Detailed structure of the substrate 112 are explained with references made to FIGS. 1C and 1D.

Figure 1C:
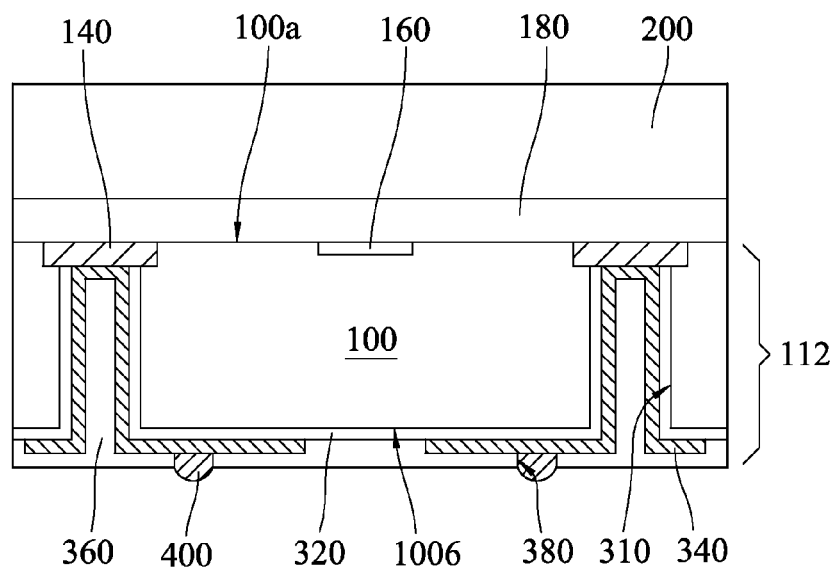
Figure 1D:
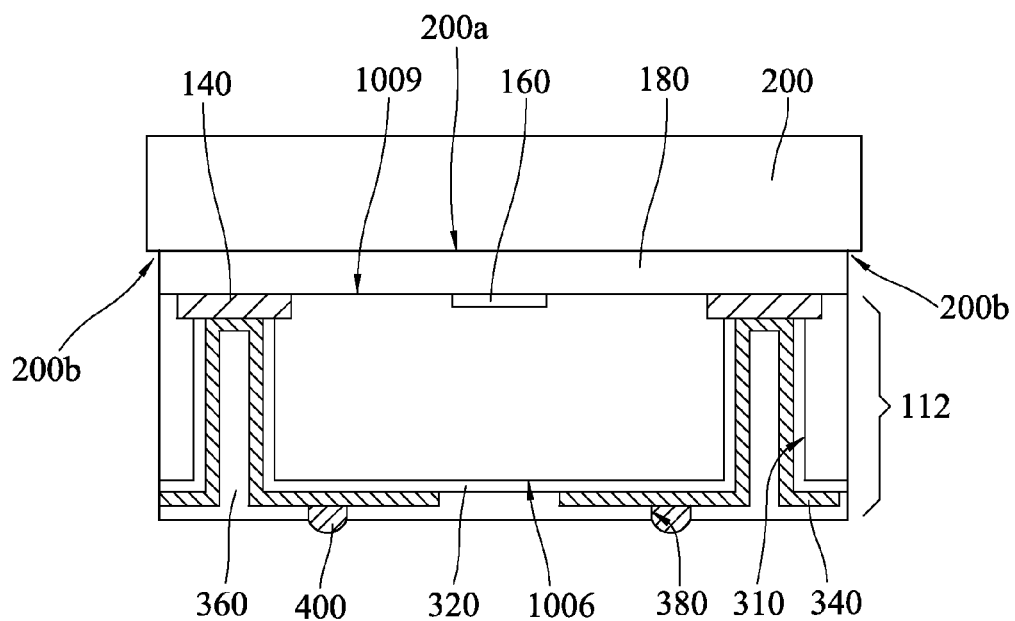
Figure 1A:
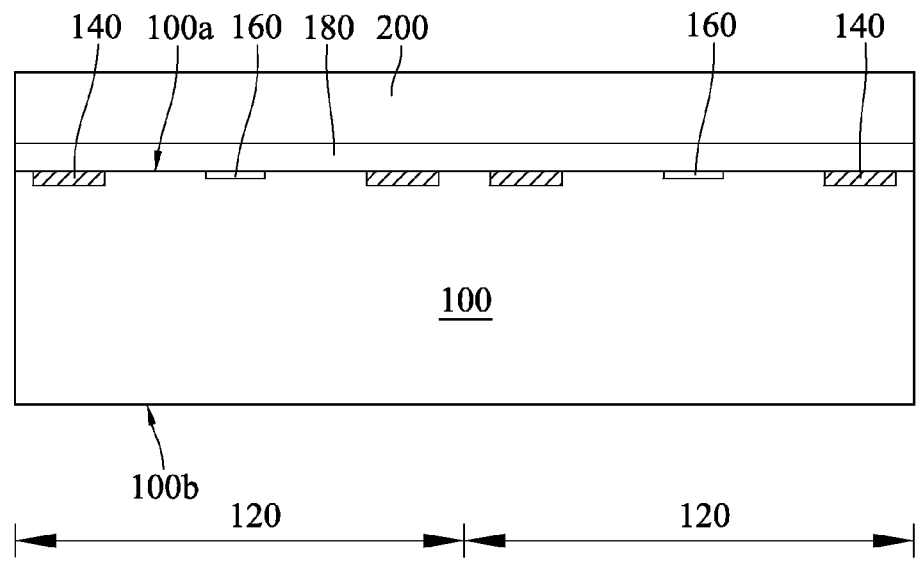
Figure 1B:
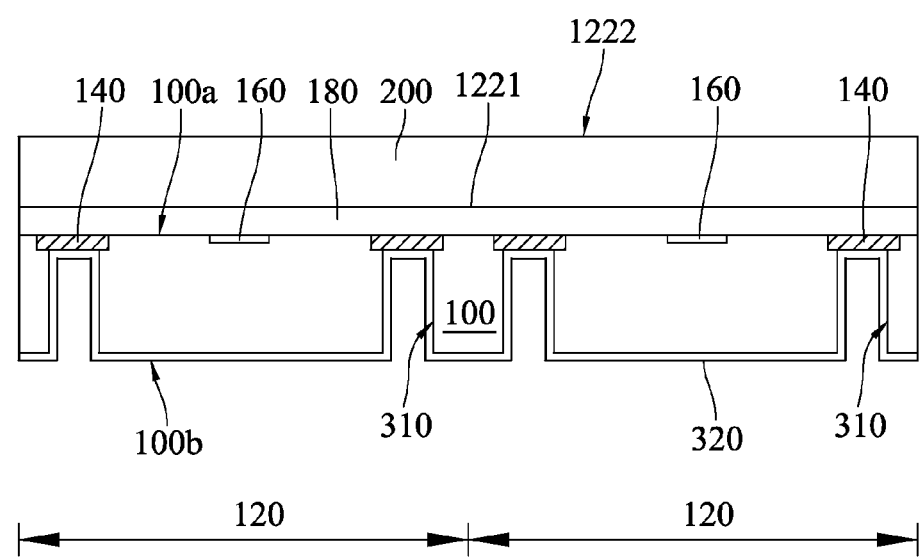
Figure 1C:
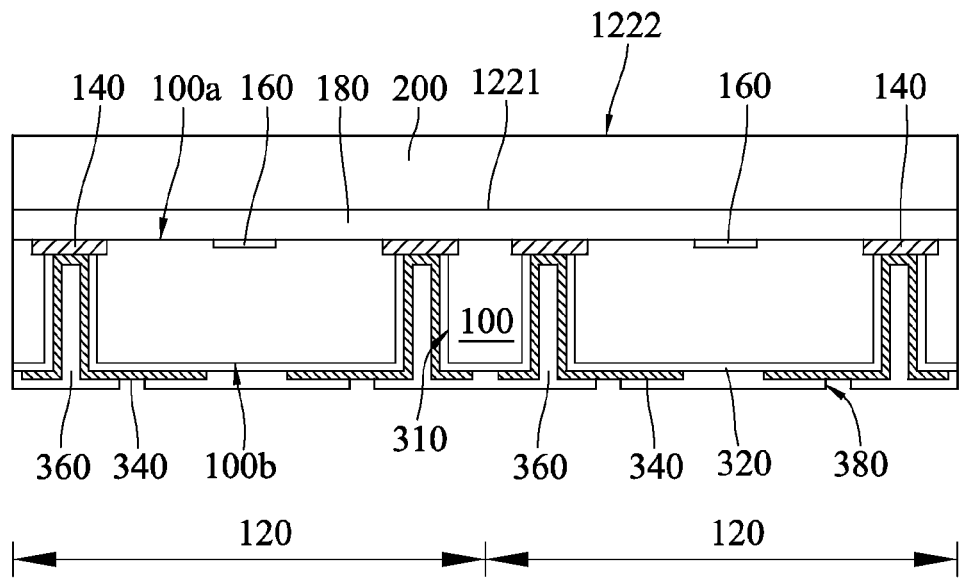
Figure 1D:
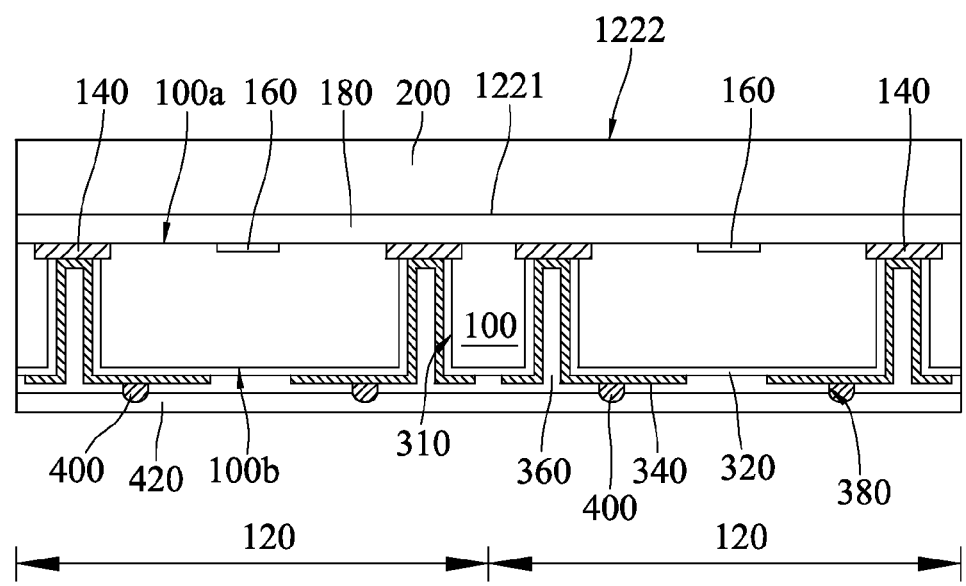

Referring to FIGS. 1C and 1D, cross-sectional views of the conventional chip package 1000 with different structures of the substrate 112 are illustrated. As shown in FIGS. 1C and 1D, the substrate 112 comprises a base layer 100 having a top surface 100a and a bottom surface 100b, a sensing device 160 adjacent to the top surface 100a, at least two conductive pads 140 adjacent to the sensing device 160, a re-distribution layer (RDL) having a plurality of wires 340 interconnecting the conductive pads 140, an insulating layer 320 which insulates the re-distribution layer (RDL) from the base film 100, openings 380 on the insulating layer 320 exposing part of the re-distribution layer (RDL), and a plurality of interconnection structures 400 such as soldering balls, conductive bumps or pillars formed on each of the openings 380 to interconnecting the exposed wires. The base layer 100 is, for example, a silicon substrate. In one embodiment, the base layer 100 is a silicon wafer which is suitable for the proceeding of a wafer-level package. In one embodiment, the sensing device 160 may comprise a sensor for sensing biometric features (i.e. a biometric sensing chip, such as a fingerprint-recognition chip). In another embodiment, the sensing device 160 may comprise a sensor for sensing environmental features, for example, a temperature sensor, a humidity sensor, a pressure sensor, a capacitance-sensing component or another suitable sensor. In yet another embodiment, the sensing device 160 may comprise an image sensor.

Comparing with the chip package as shown in FIG. 1C, the chip package shown in FIG. 1D shows part of the base layer 100 and adhesion 180 are removed to expose the edge of the third surface 1221 of the cap layer 200. The third surface 1221 of the cap layer 200 is divided into a bonding region 200a and a peripheral region 200b surrounding the bonding region 200a. A detail description of the method of manufacturing the chip package 1000 with a cross-sectional view as shown in FIG. 1D will be explained with references made to the accompanying drawings FIGS. 1A'~1D'.

Referring to FIG. 1A', a base layer 100 including a first surface 100a and a second surface 100b opposite to each other is provided. The base layer includes a plurality of chip regions 120. Each of the chip regions 120 comprises a sensing device 160 and plurality of conductive pads 140 adjacent to the first surface 100a, wherein each of the conductive pads 140 can be a single layered or a multi-layered conductive structure.

Next, referring to FIG. 1B', a cap layer 200 with a third surface 1221 and a fourth surface 1222 is capped on the base layer 1000 by an adhesion layer 180 sandwiched therebetween. Then the cap layer 200 is used as a carrier substrate during thinning the second surface 100b of the base layer 100 by means of etching, milling, mechanical grinding or chemical mechanical polishing to decrease the thickness of the base layer 100. Next, a plurality of first openings 310 are formed on each of the chip regions 120 by photolithography and etching process such as dry etching, wet etching, plasma etching, reactive-ion etching or other suitable etching process. Each of the first openings 310 extends from the second surface 100b toward the first surface 100a of the base layer 100, and exposes each of the conductive pads 140. Next, an insulating layer is conformably formed on the second surface 100b of the base layer 100 and extended into the first openings 310 by a coating process, deposition process such as CVD or PVD, or other suitable process.

Next referring to FIG. 1C', part of the insulating layer 320 on bottom of the openings 310 is removed to expose each of the conductive pads 140 by photolithography and etching process such as dry etching, wet etching, plasma etching, reactive-ion etching or other suitable etching process. Next, a patterned re-distribution layer (RDL) having a plurality wires 340 is formed on the insulating layer 320 by coating, deposition such as CVD or PVD, electroplating, non-electroplating or other suitable process and patterned by photolithography and etching process. Each of the wires 340 of the re-distribution layer is isolated with the base layer 100 by the insulating layer 320 and extends to the bottom of each openings 310 and electrically contact to each of the exposed conductive pads 140. The first openings 140 are also knowns as through silicon vias (TSV). Next, a passivation layer 360 is formed on the re-distribution layer and filled in the first openings 310 by deposition. Next, a plurality of second openings 380 are formed on the passivation layer 360 to expose part of the wires 340 in each of the chip region 120.

Next, referring to FIG. 1D', a plurality of conductive structures such as solder balls, conductive bucks or pillars are formed in the second openings 380 to contact to and interconnect with the exposed wires. In one embodiment, the conductive structures 400 can be formed by forming a solder in each of the openings 380 electroplating, screen printing or other suitable process and reflow process. In an embodiment, the conductive structures 400 are arranged as a matrix on the second surface 100b of the base layer 100. The conductive structures comprise tin (Sn), lead (Pb), cupper (Cu), gold (Au), nickel (Ni), combination thereof or other suitable conductive materials. Next, a protection layer 420 such as a transparent tape is capped on the passivation layer 360 and the conductive structures 400.

Figure 1E:
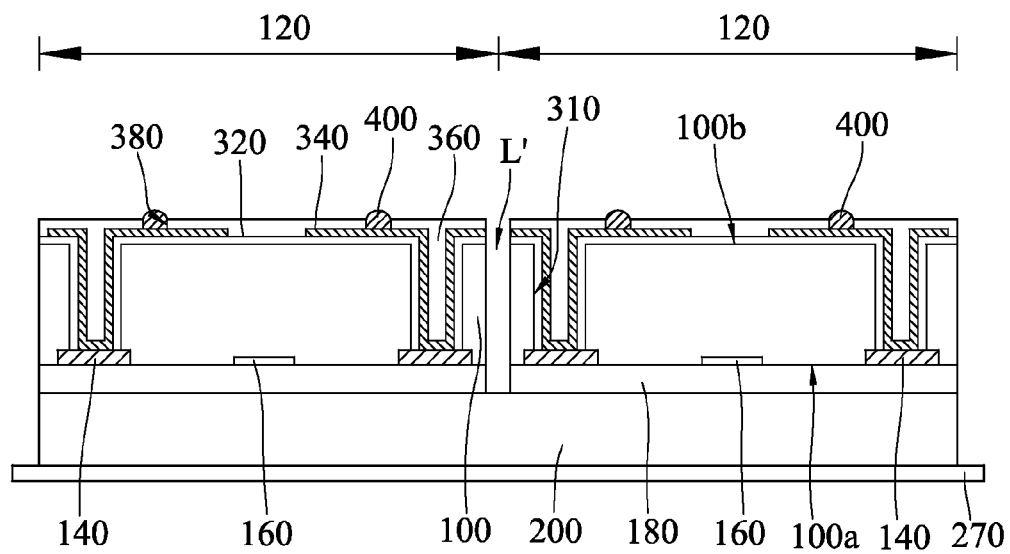

Next, referring to FIG. 1E', the semiconductor shown in FIG. 1D is flip upside and attached to another carrier plate 270 through the fourth surface 1222 of the cap layer 200. Next, the protection layer 420 is removed. Then, part of the passivation layer 360, the re-distribution layer with a plurality of wires 340, the insulating layer 320, the base layer 100 and the adhesion layer 180 near the area of adjacent chip regions 120 are removed to form a separation trench L' exposing part third surface 1221 of the cap layer 200.

Figure 1F:
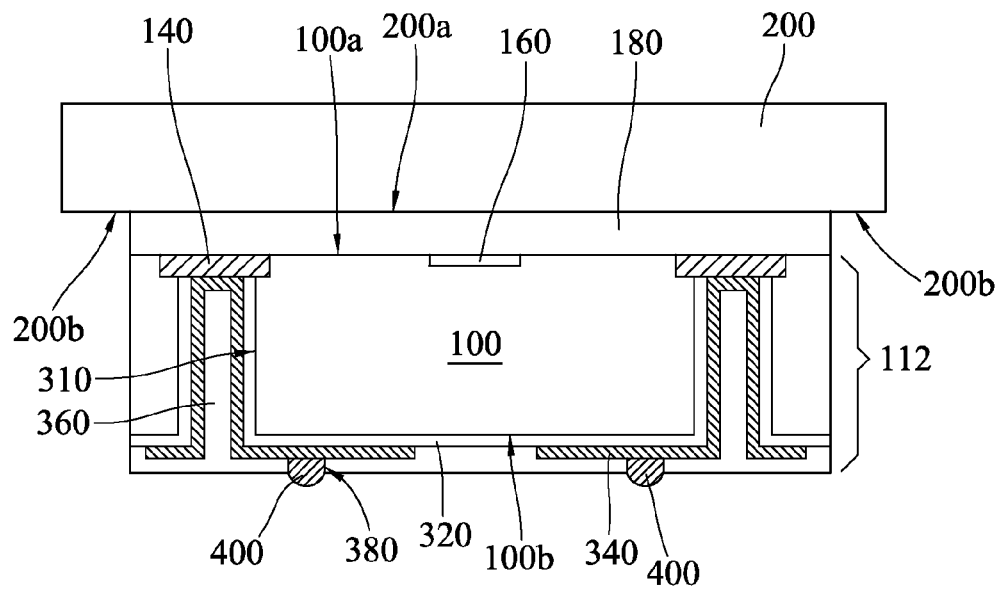

Finally, referring to FIG. 1F', a cleavage process is applied to cleave along the separation trench L' from the base layer 100 toward the cap layer 200 to obtained chip packages 1000 with a cross-sectional view as that shown in FIG. 1D.

Exemplary Embodiment 1:

FIGS. 2A~2E illustrate a separation apparatus 2000 and steps for separation a cap layer from a chip package as shown in FIG. 1C or 1D by means of this separation apparatus in accordance with exemplary embodiment 1 of the present invention. The cross-section view of the chip package shown in FIG. 1B is used to represent cross-section views of the chip packages with different substrate structures as shown in FIGS. 1C and 1D to facilitate understanding the features of the present invention.

Figure 2A:
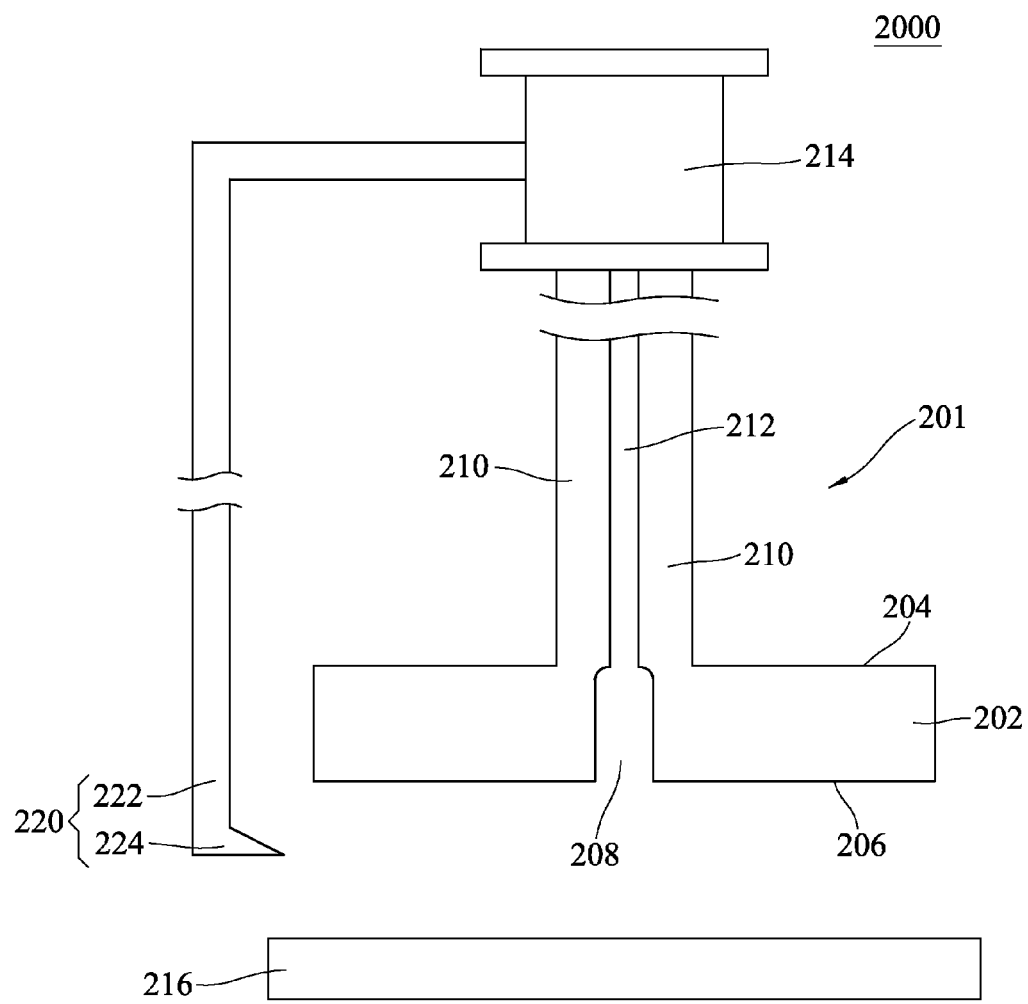
FIGS. 2A~2E are cross-sectional views of an exemplary embodiment 1 of a method for separating for separating a cap layer from a chip package according to the invention.

Referring to FIG. 2A, a separation apparatus 2000 in accordance with exemplary embodiment 1 of the present invention is provided. The separation apparatus 2000 comprises a vacuum nozzle head 201 including a suction pad 202 having a top surface 204 and a bottom surface 206, a through hole 208 penetrating the top surface 204 and the bottom surface 206 of the suction pad 202, and a hollow vacuum pipe 210 having an airway 212 connecting to the through hole 208 to a vacuum pump (not shown); a stage 216 positing under the vacuum nozzle head 201 and substantially aligning with the suction pad 202; a control means 214 coupling to the vacuum nozzle head 201 to lift upward or lower down the vacuum nozzle head 201; and a first cutter 220 comprising a first cutting body 222 and a first knife 224 connecting to the first cutting body 222.

Figure 2B:
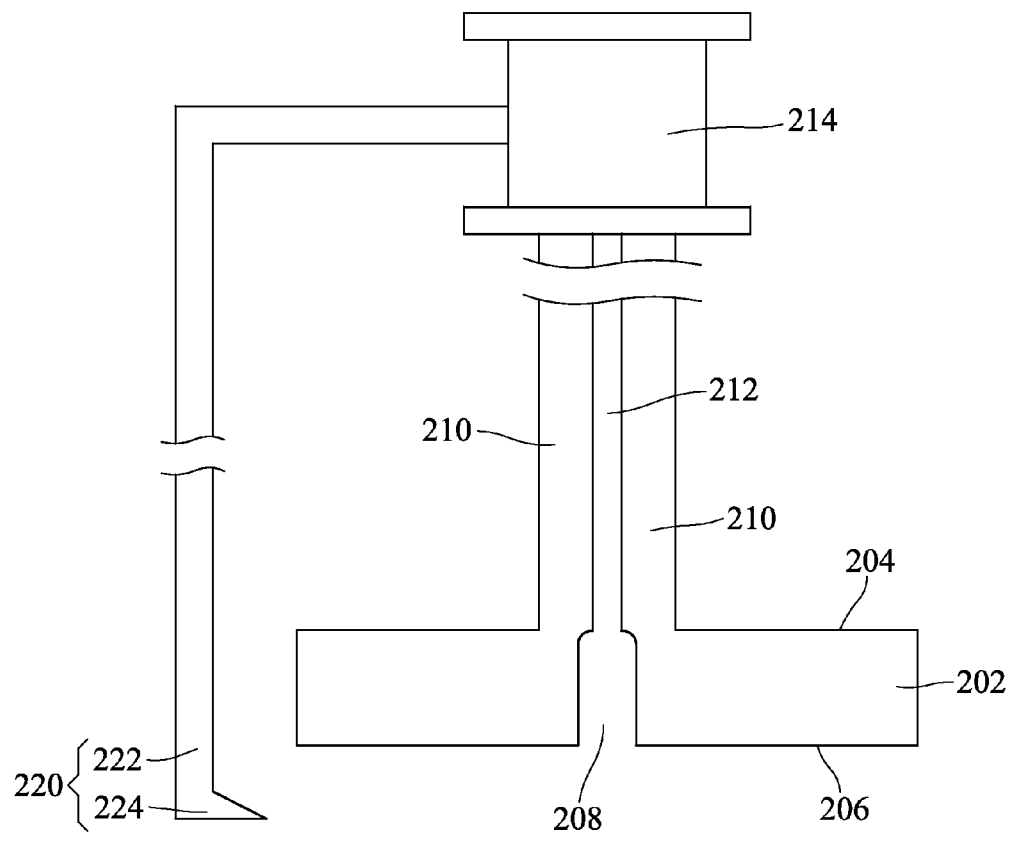
Figure 2B:
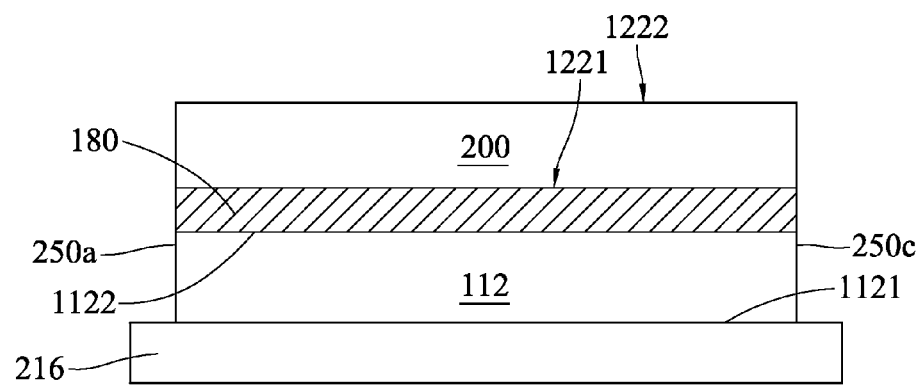
Figure 2C:
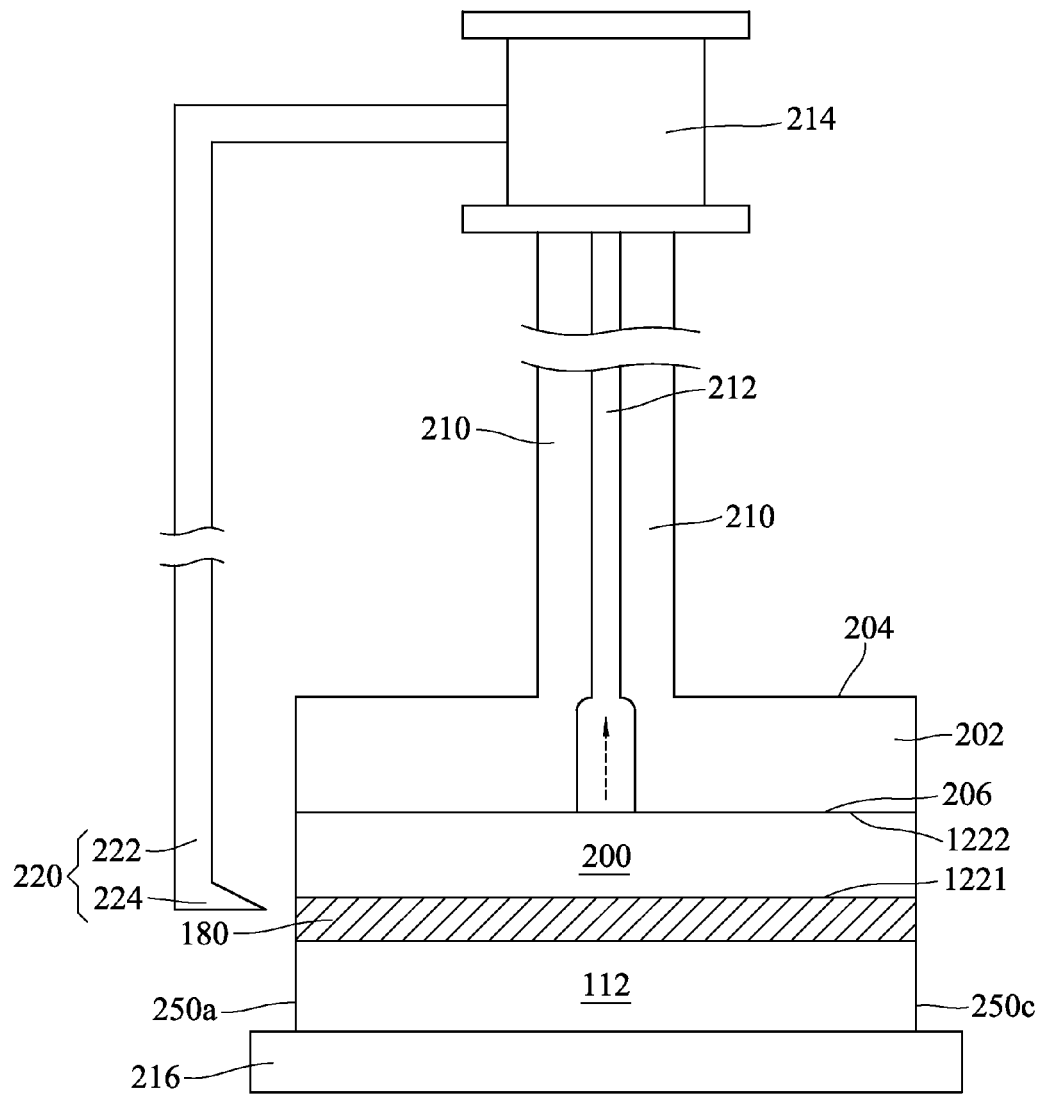

Next, referring to FIGS. 2B and 2C, a chip package 1000 as shown in FIG. 1B is provided and placed on the stage 216 through the second surface 1221. Then the fourth surface 1222 of the cap layer 200 is pressed against by the bottom surface 206 of the suction pad 202 by operating the control means 214 to lower down the vacuum nozzle head 201. Then cap layer 200 is sucked by the suction pad 202 of the vacuum nozzle head 201 after the vacuum pump begins to vacuum the air within the hollow airway 212 and the through hole 208.

Figure 2D:
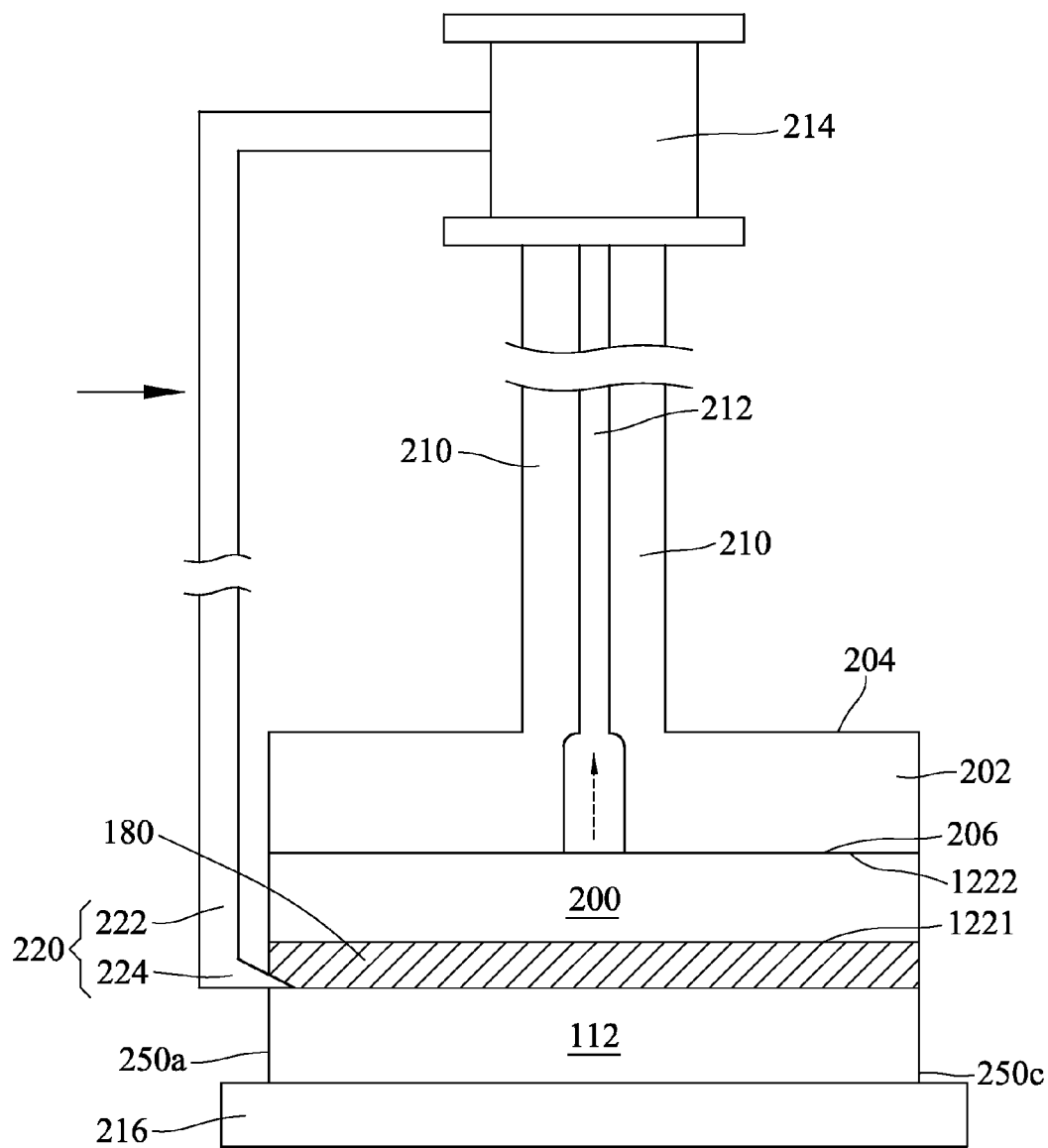

Next, referring to FIG. 2D, the first cutter 220 is moved toward the first sidewall 250a of the chip package 2000 by operating the control means 214 to make the first knife 224 cut into the adhesion layer 180 along the third surface 1221 of the cap layer 200 near the first sidewall 250a to reduce the adhesion force between the cap layer 200 and the substrate 112.

Figure 2E:
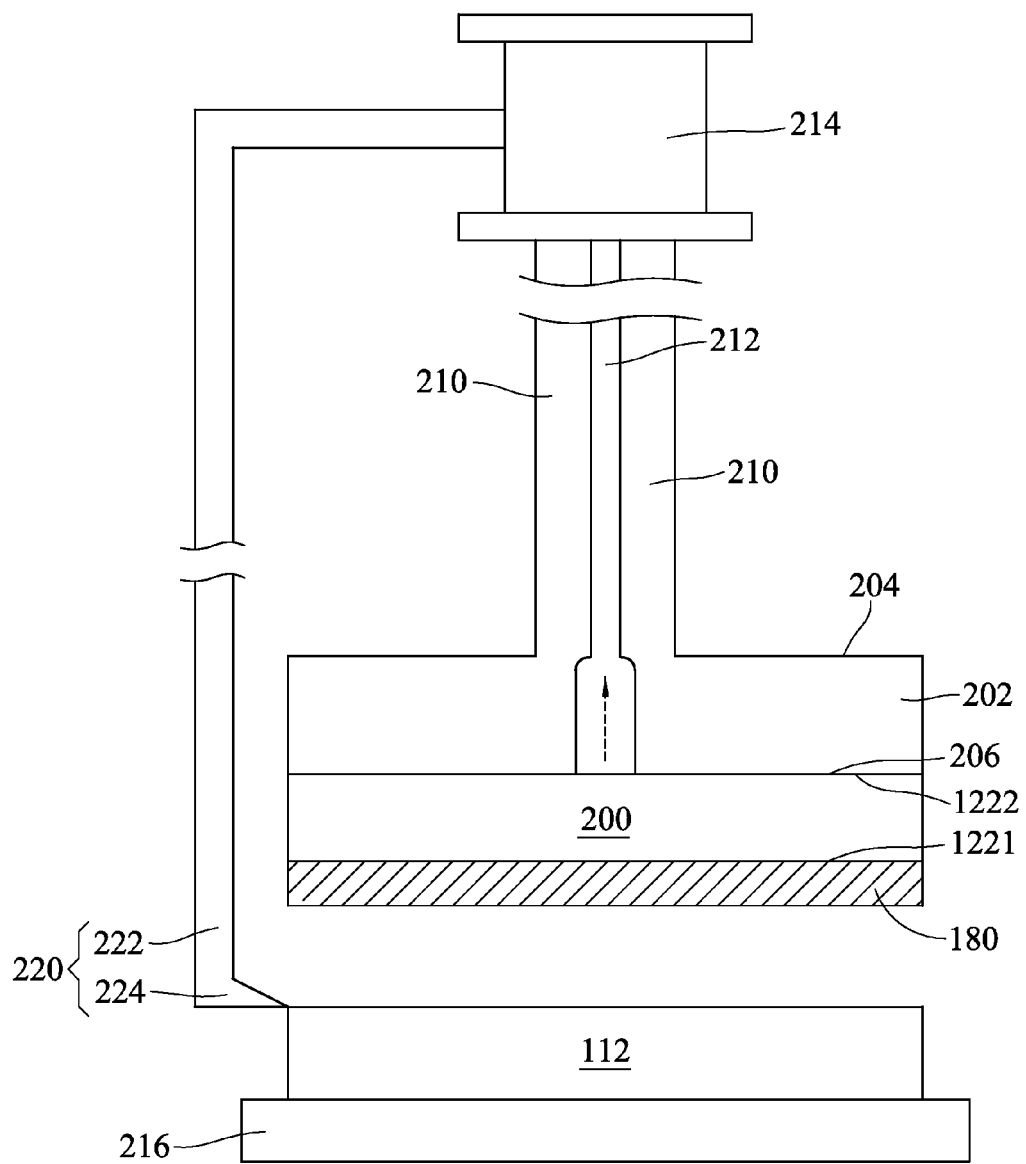

Finally, referring to FIG. 2E, the vacuum nozzle head 201 is lifted upward by the control means 214 to separate the cap layer 200 and the adhesion layer 180 from the substrate 112.

In one embodiment, the chip package 1000 include a third surface 1221 having a peripheral region 200b as shown in FIG. 1D. The peripheral region 200b makes the first knife 224 cut into the adhesion layer 180 more precisely along the edge of the third surface 1221 near the peripheral region 200b. Moreover, the first knife 224 hooks on to the peripheral region 200b to facilitate the separation of the cap layer 200 and the adhesion layer 180 from the substrate 112 when the vacuum nozzle head 201 is lift upward by the control means 214.

In one embodiment, the chip package 1000 is pre-treated with light exposure and/or heating before separated by the separation apparatus 201 to facilitate the separation of the cap layer 200 and the adhesion 180 from the substrate 112 when the adhesion layer 180 comprises a light sensitive resin such as UV glue. The pre-treatment of light exposure is proceed by irradiate the chip package 1000 by irradiated with UV light having a wavelength of 254 nm, and the pre-treatment of heating is proceeded at a temperature ranging from 25 degree C. to 60 degree C.

Exemplary Embodiment 2:

FIGS. 3A~3E illustrate another separation apparatus 3000 and steps for separation a cap layer from a chip package as shown in FIG. 1C or 1D by means of this separation apparatus in accordance with exemplary embodiment 2 of the present invention. The cross-section view of the chip package shown in FIG. 1B is used to represent cross-section views of the chip packages with different substrate structures as shown in FIGS. 1C and 1D to facilitate understanding the features of the present invention.

Figure 3A:
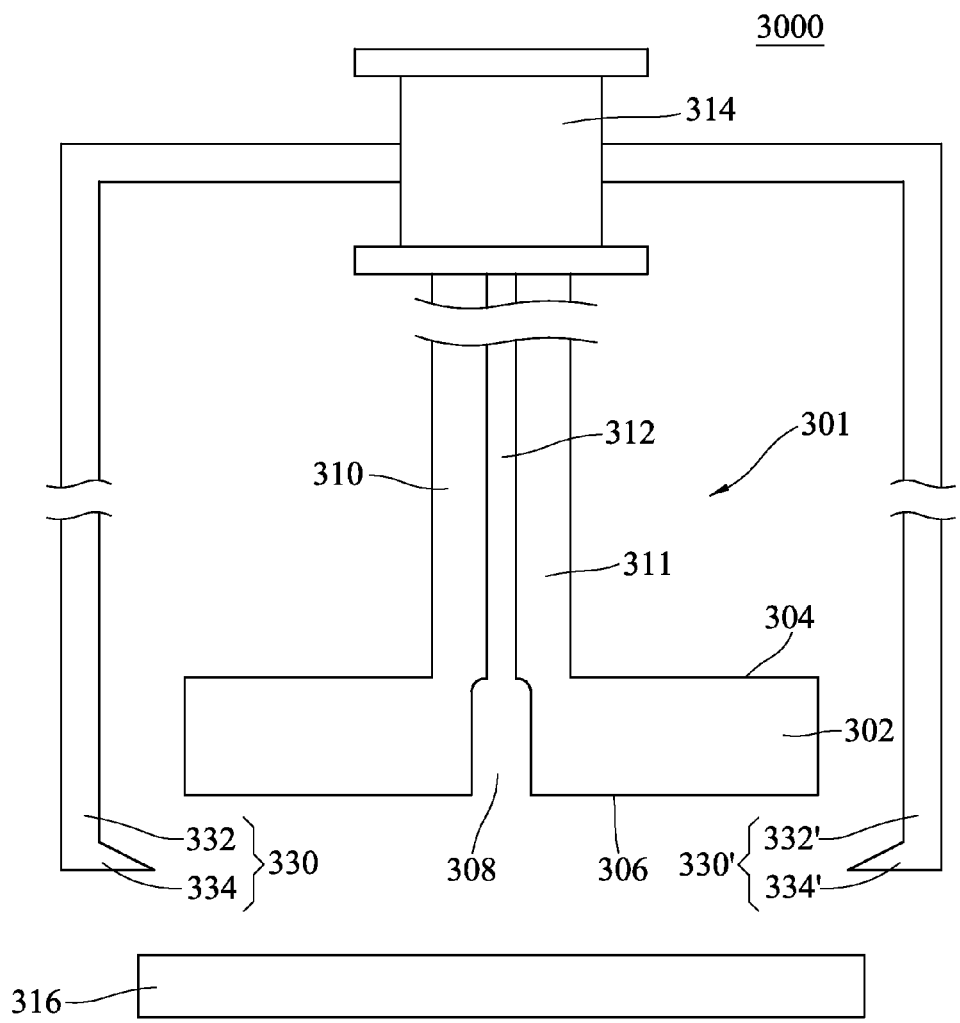
FIGS. 3A~3E are cross-sectional views of an exemplary embodiment 2 of a method for separating for separating a cap layer from a chip package according to the invention.

Referring to FIG. 3A, a separation apparatus 3000 in accordance with exemplary embodiment 2 of the present invention is provided. The separation apparatus 3000 comprises a vacuum nozzle head 301 including a suction pad 302 having a top surface 304 and a bottom surface 306, a through hole 308 penetrating the top surface 304 and the bottom surface 306 of the suction pad 302, and a hollow vacuum pipe 310 having an airway 312 connecting to the through hole 208 to a vacuum pump (not shown); a stage 316 positing under the vacuum nozzle head 301 and substantially aligning with the suction pad 302; a control means 314 coupling to the vacuum nozzle head 301 to lift upward or lower down the vacuum nozzle head 301; a first cutter 330 comprising a first cutting body 332 and a first knife 334 connecting to the first cutting body 332; and a second cutter 330' comprising a second cutting body 332' and a second knife 334' connecting to the second cutting body 332'.

Figure 3B:
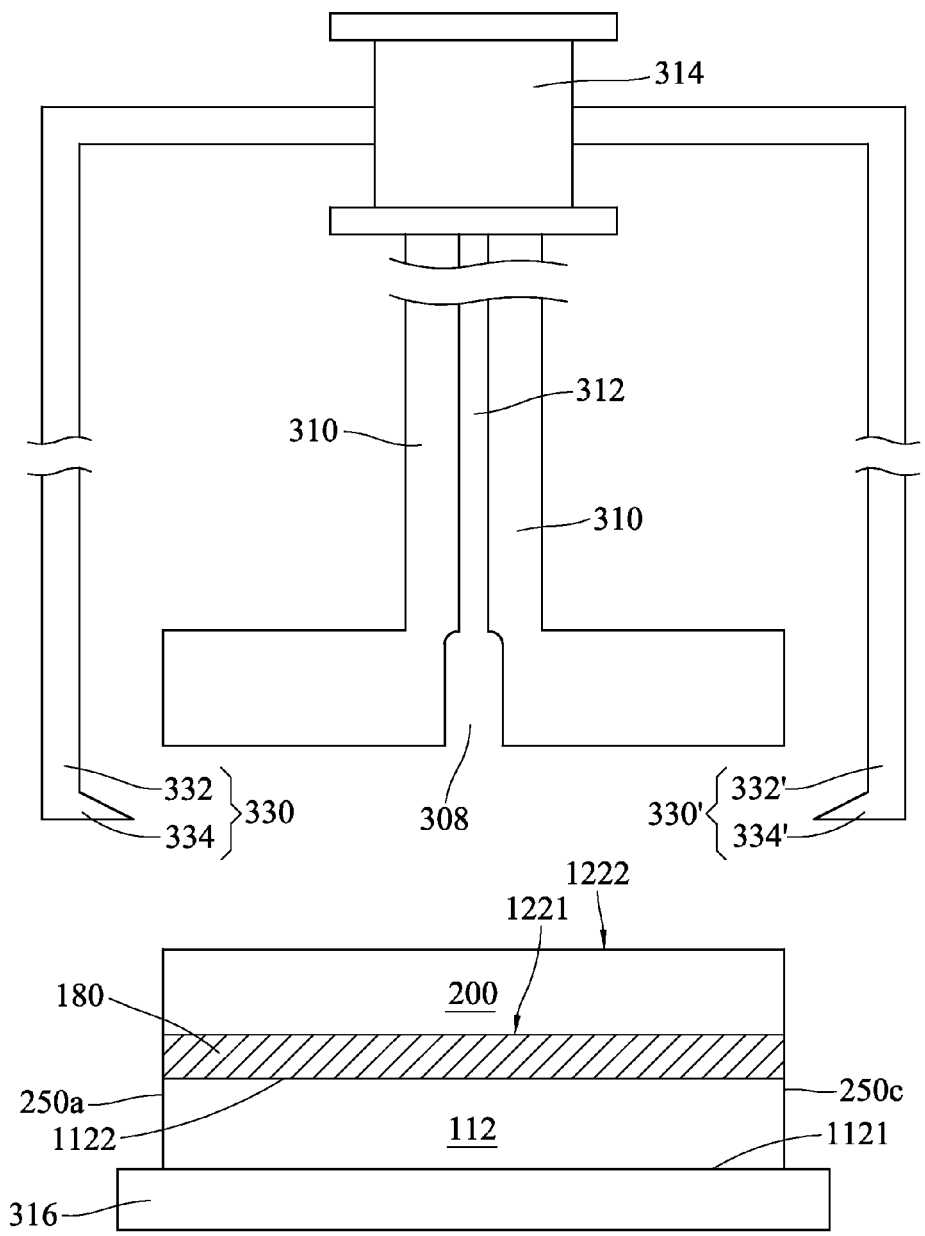
Figure 3C:
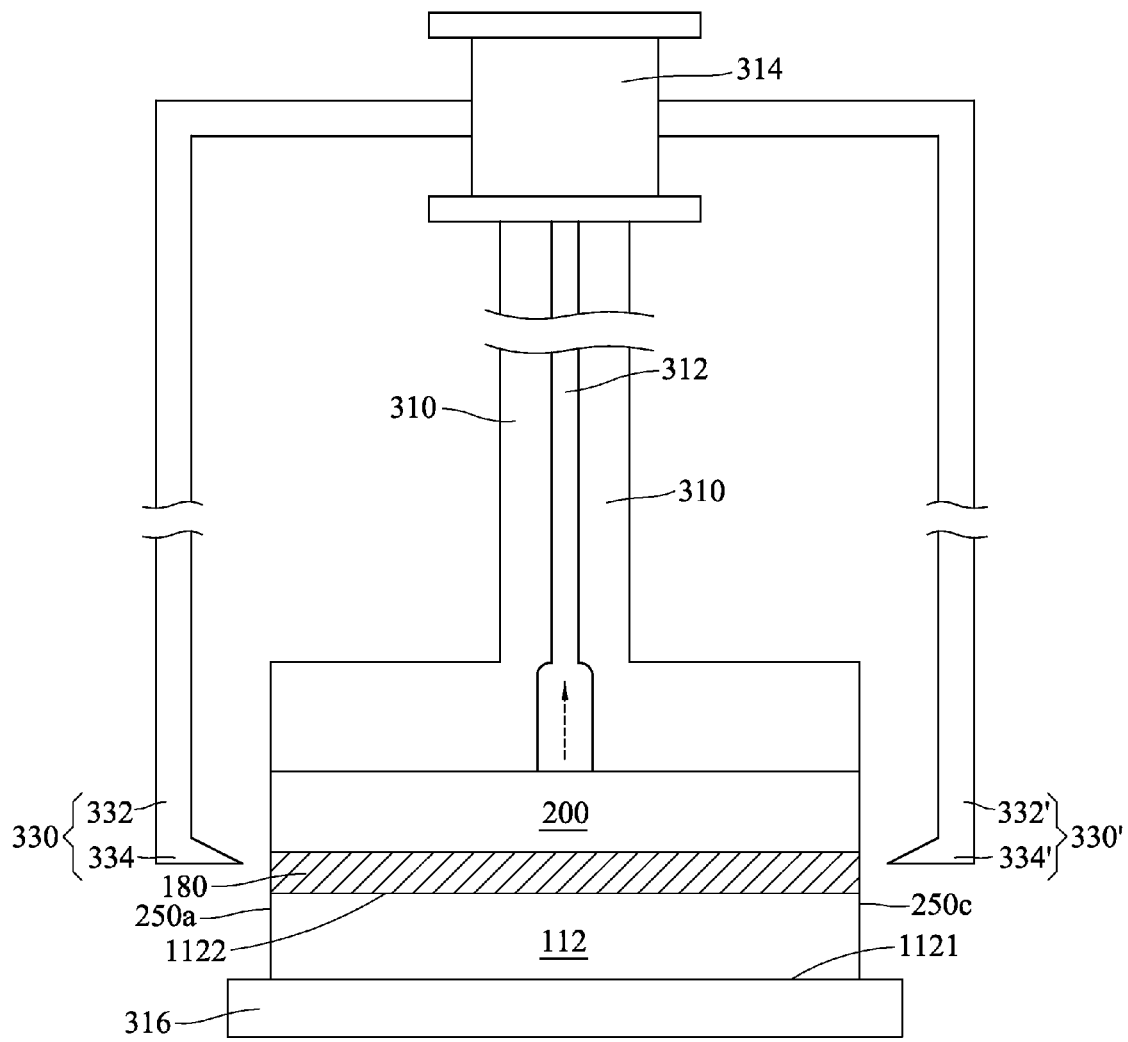

Next, referring to FIGS. 3B and 3C, a chip package 1000 as shown in FIG. 1B is provided and placed on the stage 316 through the second surface 1221. Then the fourth surface 1222 of the cap layer 200 is pressed against by the bottom surface 306 of the suction pad 302 by operating the control means 314 to lower down the vacuum nozzle head 301. Then cap layer 200 is sucked by the suction pad 302 of the vacuum nozzle head 301 after the vacuum pump begins to vacuum the air within the hollow airway 312 and the through hole 308.

Figure 3D:
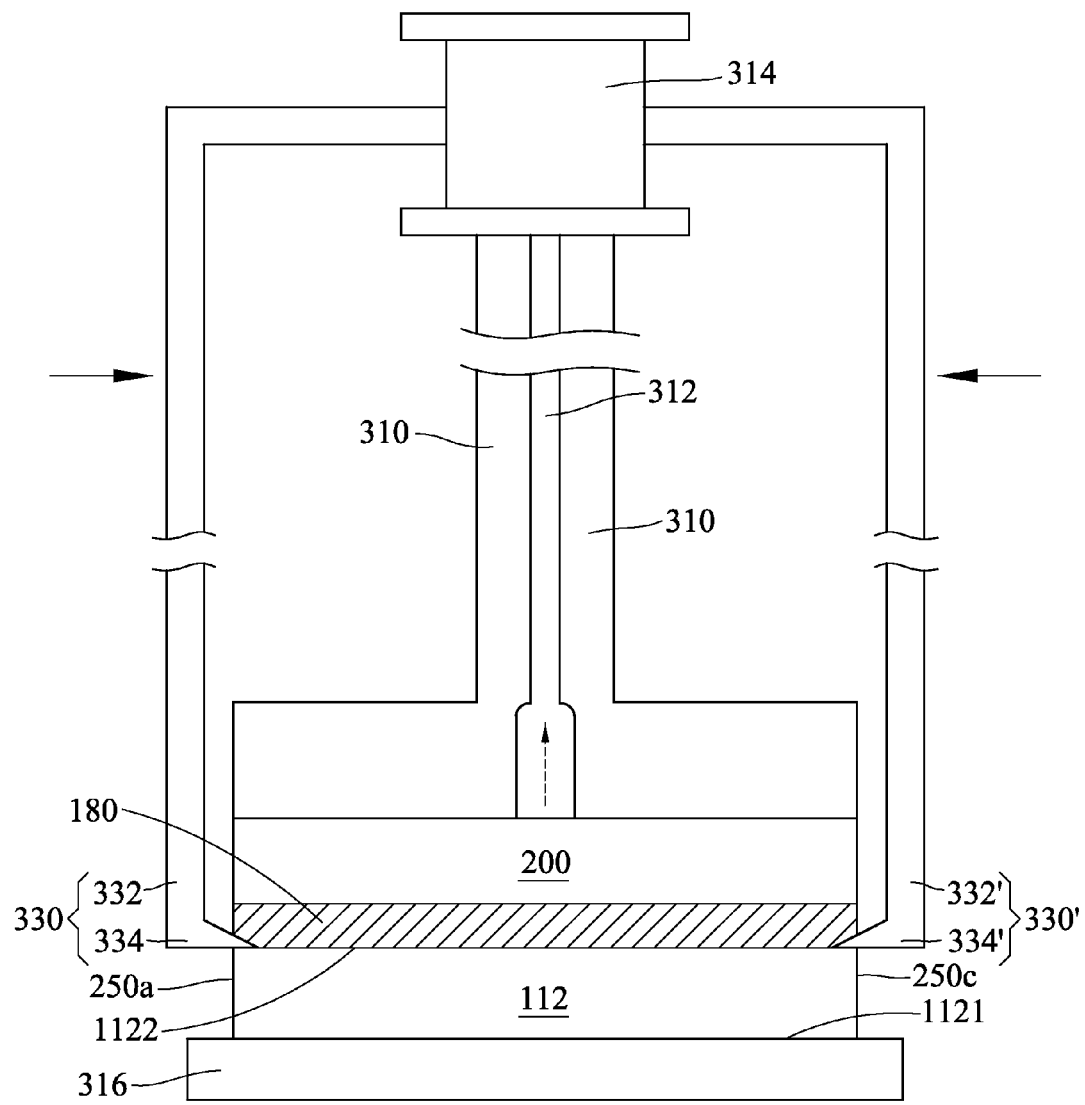

Next, Referring to FIG. 3D, the first cutter 330 and the second cutter 330' are respectively moved toward the first sidewall 250a and the second sidewall 250b of the chip package 2000 by operating the control means 314 to make the first knife 334 and the second knife 334' cut into the adhesion layer 180 along the third surface 1221 of the cap layer 200 near the first sidewall 250a and the second sidewall 250b to reduce the adhesion force between the cap layer 200 and the substrate 112.

Figure 3E:
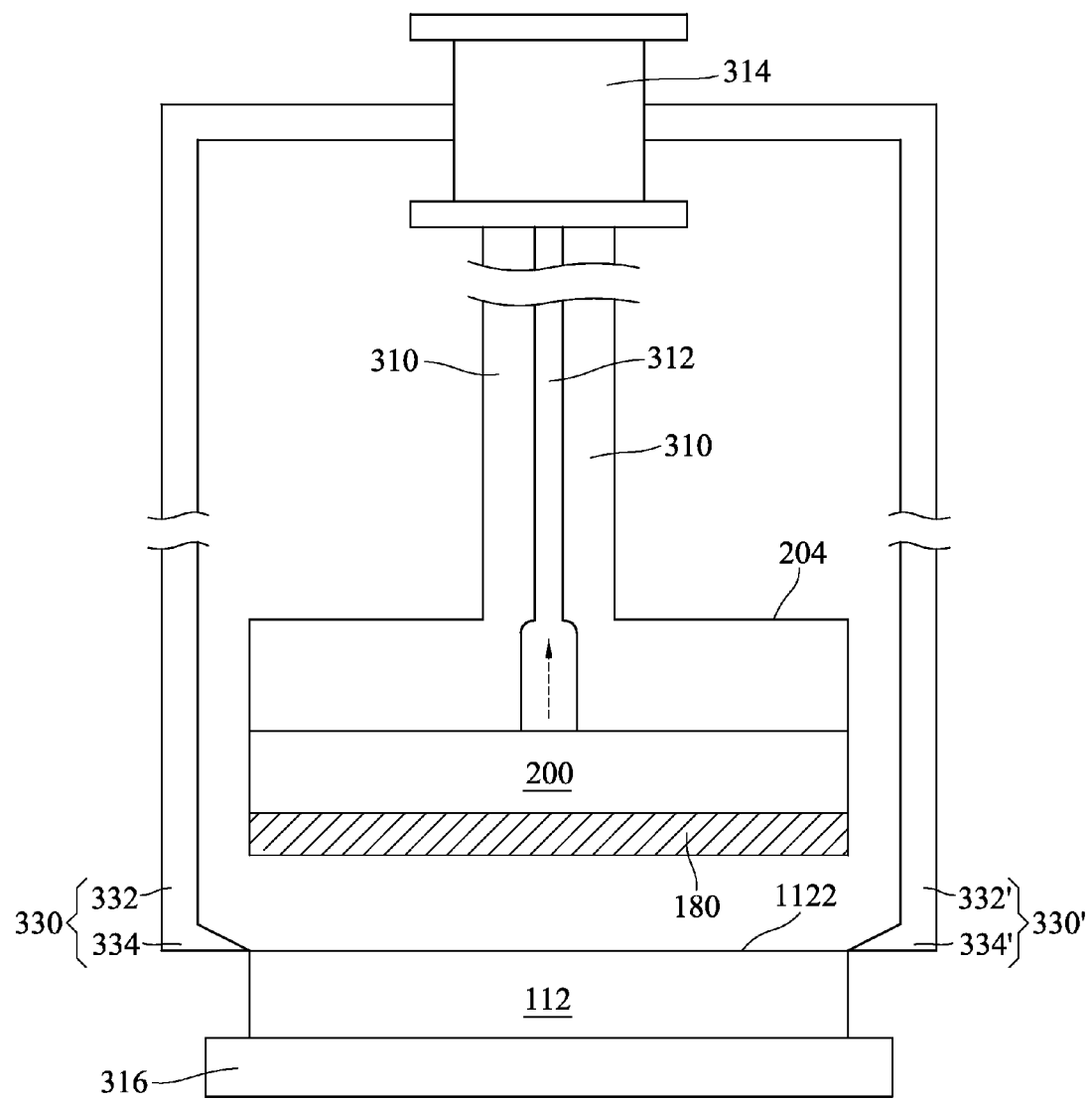

Finally, referring to FIG. 3E, the vacuum nozzle head 301 is lifted upward by the control means 314 to separate the cap layer 200 and the adhesion layer 180 from the substrate 112.

In one embodiment, the chip package 1000 include a third surface 1221 having a peripheral region 200b as shown in FIG. 1D. The peripheral region 200b makes the first knife 334 and the second knife 334' cut into the adhesion layer 180 more precisely along the edge of the third surface 1221 near the peripheral region 200b. Moreover, the first knife 334 and the second knife 334' hook on to the peripheral region 200b to facilitate the separation of the cap layer 200 and the adhesion layer 180 from the substrate 112 when the vacuum nozzle head 301 is lift upward by the control means 314.

In one embodiment, the chip package 1000 is pre-treated with light exposure and/or heating before separated by the separation apparatus 301 to facilitate the separation of the cap layer 200 and the adhesion 180 from the substrate 112 when the adhesion layer 180 comprises a light sensitive resin such as UV glue. The pre-treatment of light exposure is proceed by irradiate the chip package 1000 by irradiated with UV light having a wavelength of 254 nm, and the pre-treatment of heating is proceeded at a temperature ranging from 25 degree C. to 60 degree C.

Exemplary Embodiment 3:

FIGS. 4A~4E illustrate another separation apparatus 4000 and steps for separation a cap layer from a chip package as shown in FIG. 1C or 1D by means of this separation apparatus in accordance with exemplary embodiment 3 of the present invention. The cross-section view of the chip package shown in FIG. 1B is used to represent cross-section views of the chip packages with different substrate structures as shown in FIGS. 1C and 1D to facilitate understanding the features of the present invention.

Figure 4A:
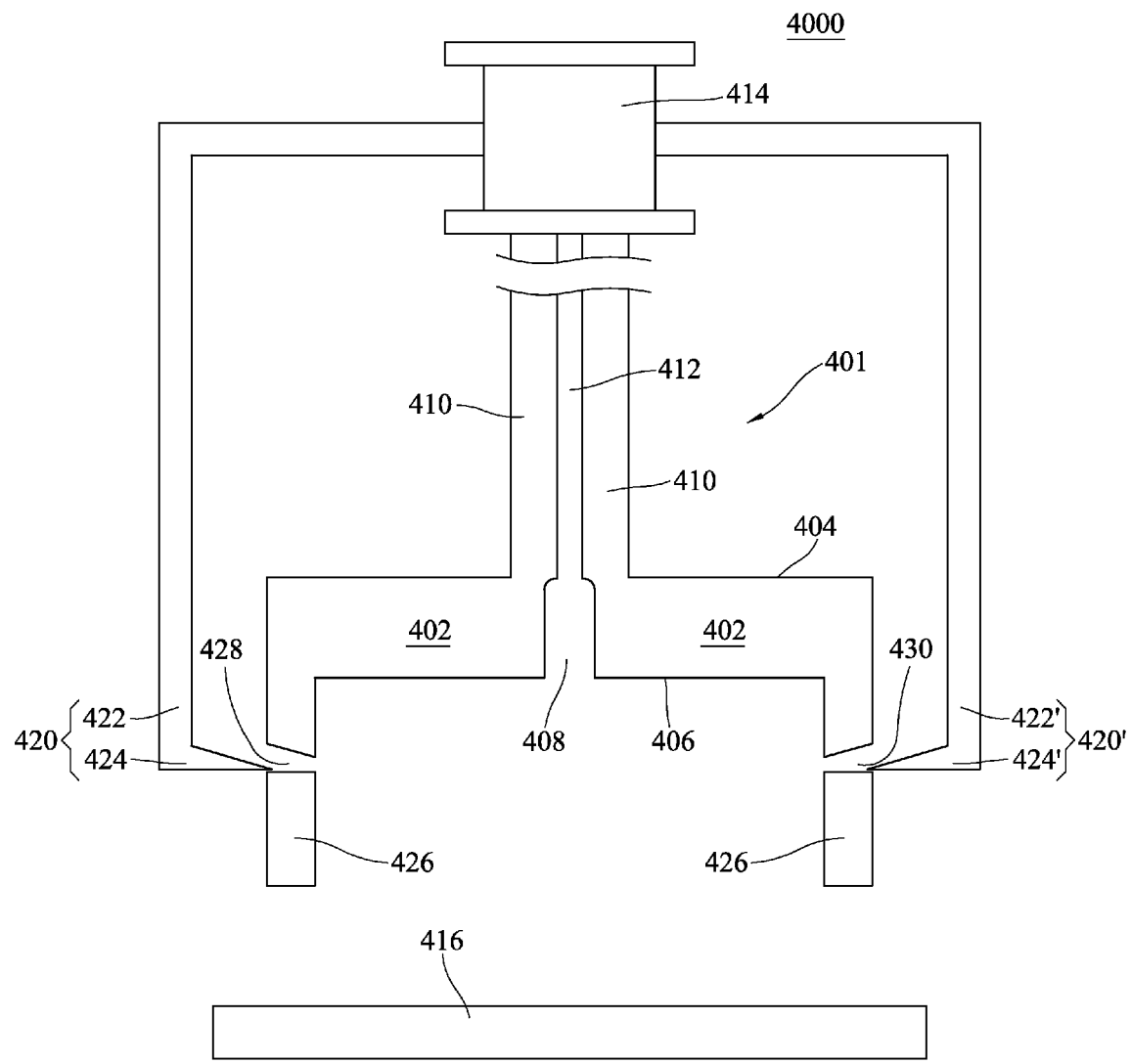
FIGS. 4A~4E are cross-sectional views of an exemplary embodiment 3 of a method for separating for separating a cap layer from a chip package according to the invention.

Referring to FIG. 4A, a separation apparatus 4000 in accordance with exemplary embodiment 3 of the present invention is provided. The separation apparatus 4000 comprises a vacuum nozzle head 401 including a suction pad 402 having a top surface 404 and a bottom surface 406, a through hole 408 penetrating the top surface 404 and the bottom surface 406 of the suction pad 402, an edge frame 426 with a first slit 428 and a second slit 430 surrounding the bottom surface 406 of the suction pad 402 and a hollow vacuum pipe 410 having an airway 412 connecting to the through hole 408 to a vacuum pump (not shown); a stage 416 positing under the vacuum nozzle head 401 and substantially aligning with the suction pad 402; a control means 414 coupling to the vacuum nozzle head 401 to lift upward or lower down the vacuum nozzle head 401; a first cutter 420 comprising a first cutting body 422 and a first knife 424 connecting to the first cutting body 422; and a second cutter 420' comprising a second cutting body 422' and a second knife 424' connecting to the second cutting body 422'.

Figure 4B:
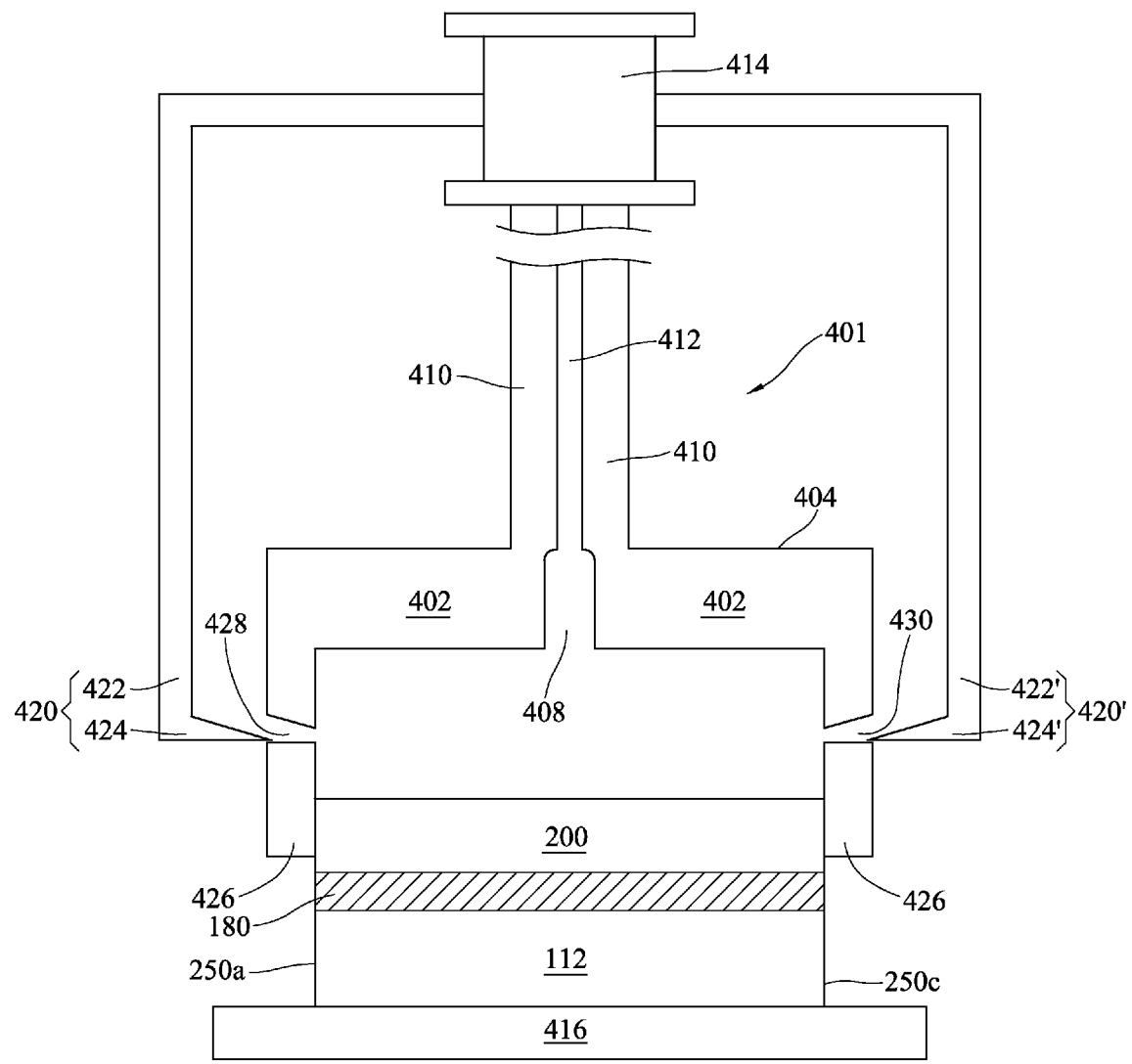
Figure 4C:
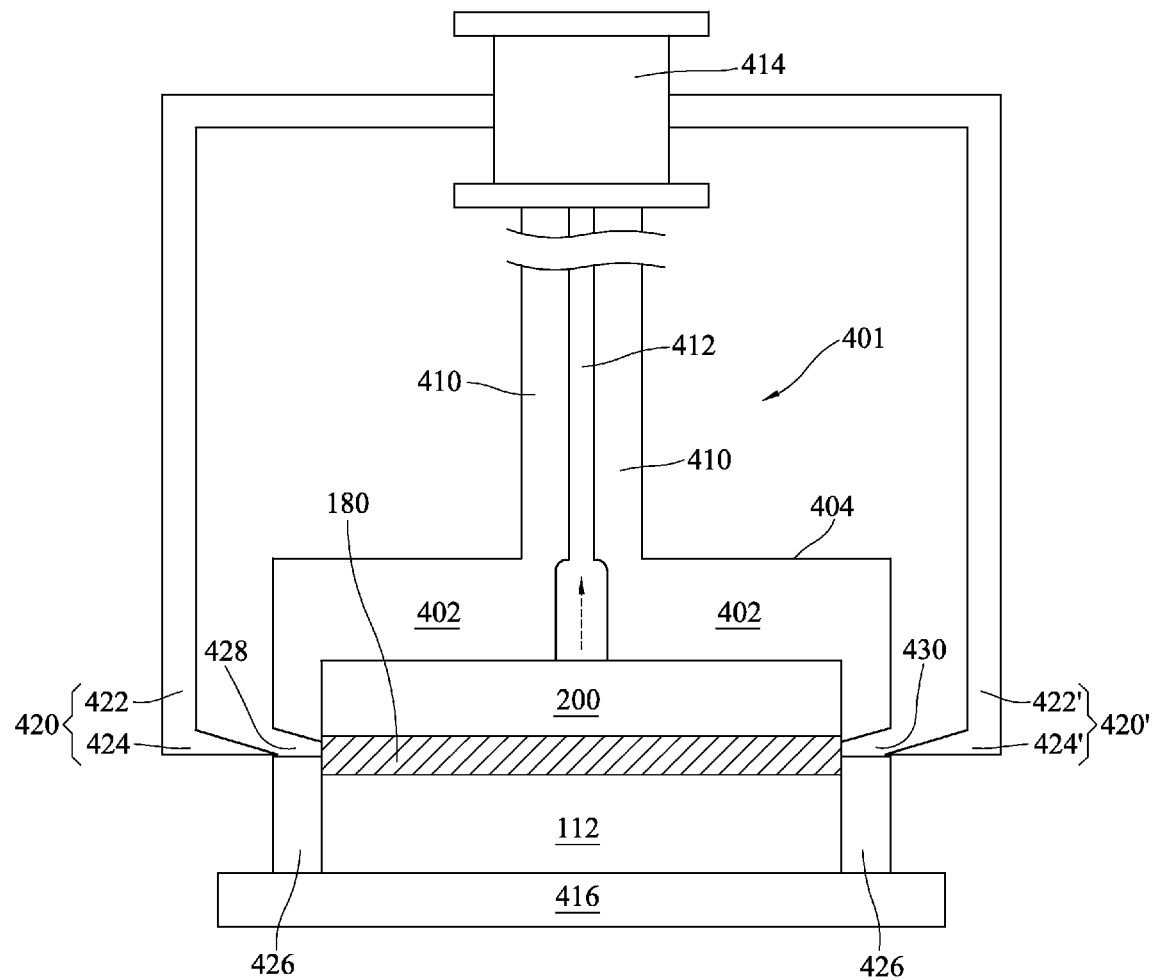

Next, referring to FIGS. 4B and 4C, a chip package 1000 as shown in FIG. 1B is provided and placed on the stage 416 through the second surface 1221. Then the fourth surface 1222 of the cap layer 200 is pressed against by the bottom surface 406 of the suction pad 402 and the first sidewall 250a, the second sidewall 250b, the third sidewall 250c and the fourth sidewall 250d are press against by the edge frame 426 by operating the control means 414 to lower down the vacuum nozzle head 401. Then cap layer 200 is sucked by the suction pad 202 of the vacuum nozzle head 401 after the vacuum pump begins to vacuum the air within the hollow airway 412 and the through hole 408.

Figure 4D:
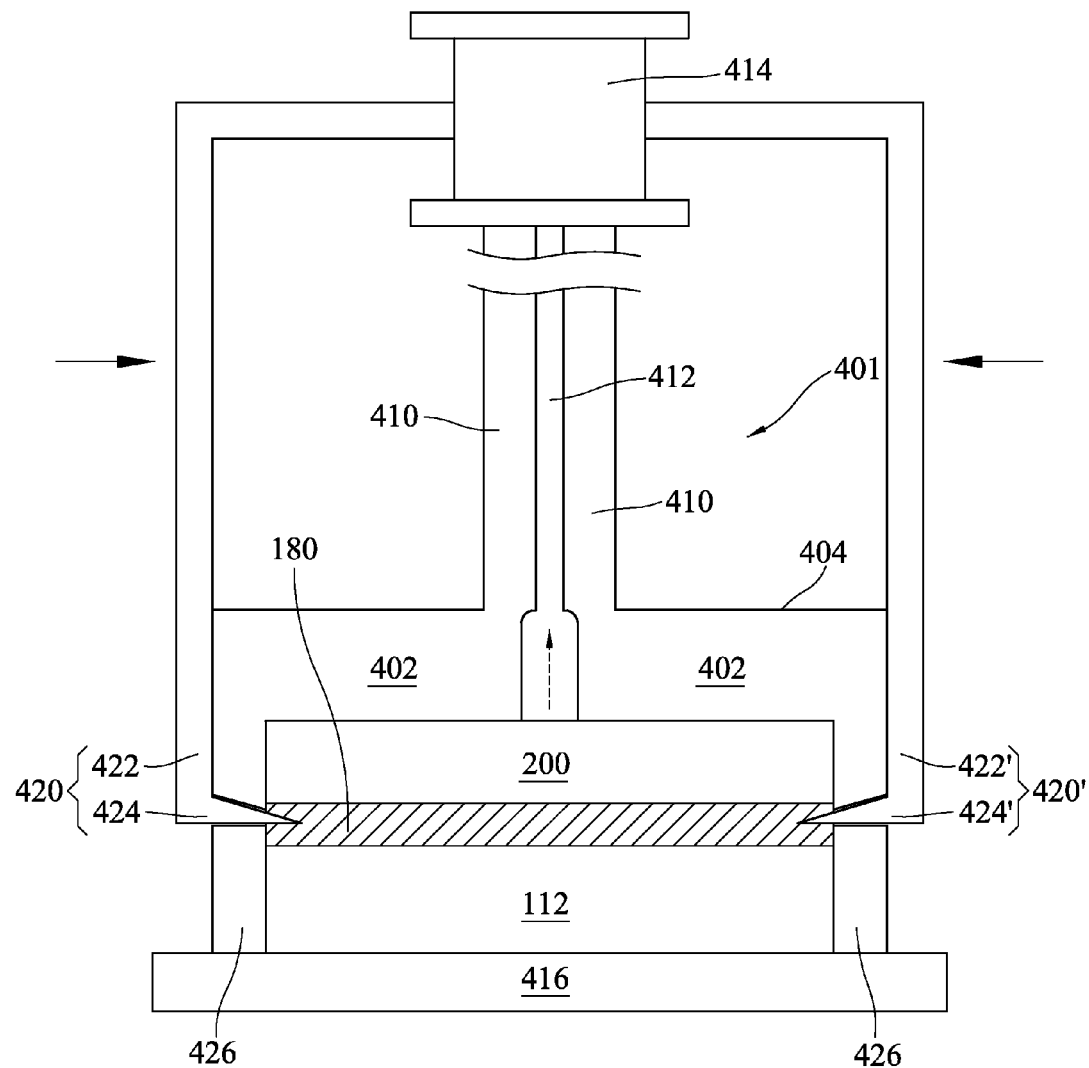

Next, Referring to FIG. 4D, the first cutter 420 and the second cutter 420' are respectively moved toward the first sidewall 250a and the second sidewall 250b of the chip package 2000 by operating the control means 314 to make the first knife 334 and the second knife 334' respectively pass through the first slit 428 and the second slit 430 and cut into the adhesion layer 180 along the third surface 1221 of the cap layer 200 near the first sidewall 250a and the second sidewall 250b to reduce the adhesion force between the cap layer 200 and the substrate 112.

Figure 4E:
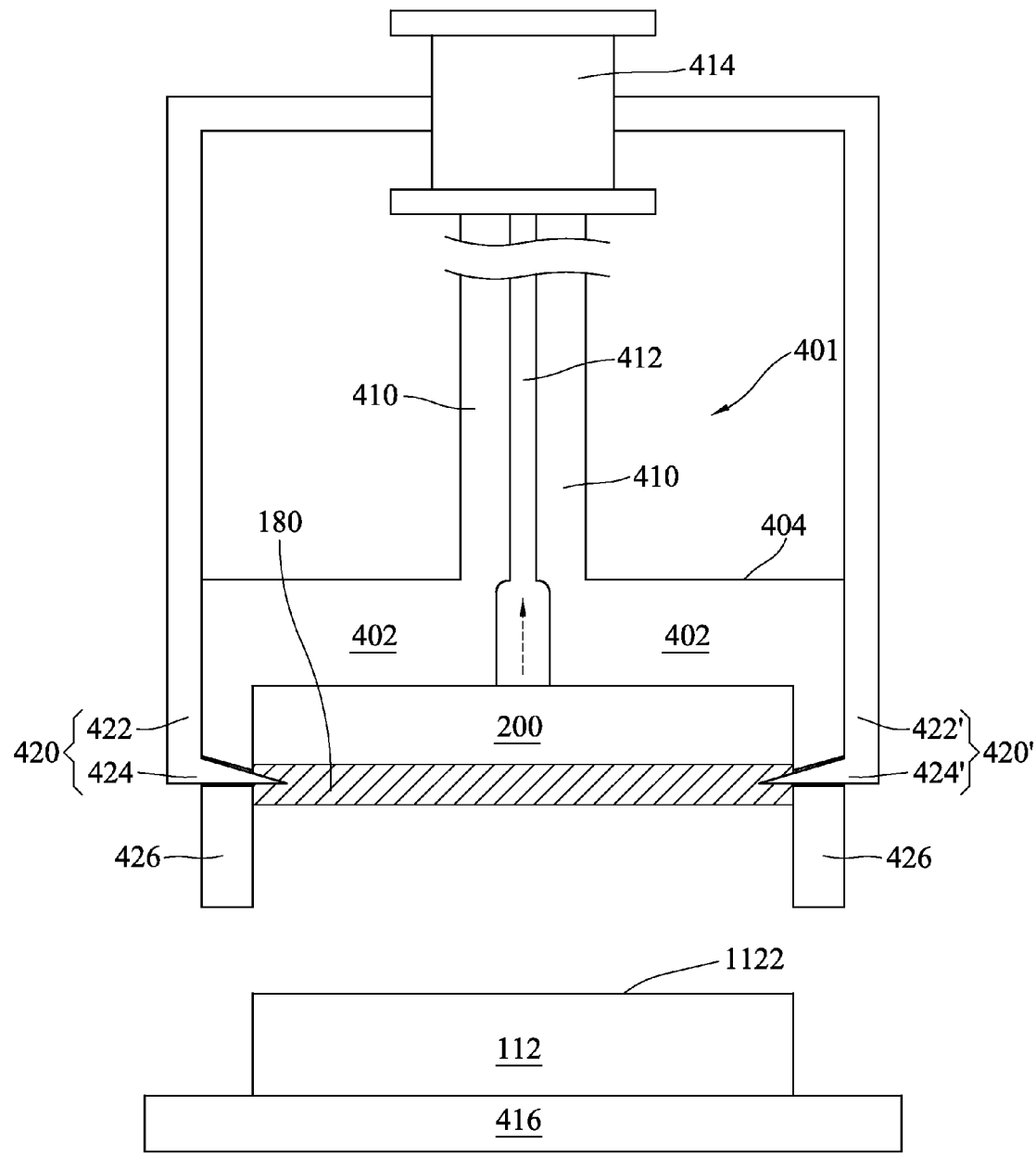

Finally, referring to FIG. 4E, the vacuum nozzle head 401 is lifted upward by the control means 414 to separate the cap layer 200 and the adhesion layer 180 from the substrate 112.

In one embodiment, the chip package 1000 include a third surface 1221 having a peripheral region 200b as shown in FIG. 1D. The peripheral region 200b makes the first knife 424 and the second knife 424' cut into the adhesion layer 180 more precisely along the edge of the third surface 1221 near the peripheral region 200b. Moreover, the first knife 424 and the second knife 424' hook on to the peripheral region 200b to facilitate the separation of the cap layer 200 and the adhesion layer 180 from the substrate 112 when the vacuum nozzle head 301 is lift upward by the control means 314.

In one embodiment, the chip package 1000 is pre-treated with light exposure and/or heating before separated by the separation apparatus 401 to facilitate the separation of the cap layer 200 and the adhesion 180 from the substrate 112 when the adhesion layer 180 comprises a light sensitive resin such as UV glue. The pre-treatment of light exposure is proceed by irradiate the chip package 1000 by irradiated with UV light having a wavelength of 254 nm, and the pre-treatment of heating is proceeded at a temperature ranging from 25 degree C. to 60 degree C.

Exemplary Embodiment 4:

FIGS. 5A~5D illustrate another separation apparatus 5000 and steps for separation a cap layer from a chip package as shown in FIG. 1C or 1D by means of this separation apparatus in accordance with exemplary embodiment 4 of the present invention. The cross-section view of the chip package shown in FIG. 1B is used to represent cross-section views of the chip packages with different substrate structures as shown in FIGS. 1C and 1D to facilitate understanding the features of the present invention.

Figure 5A:
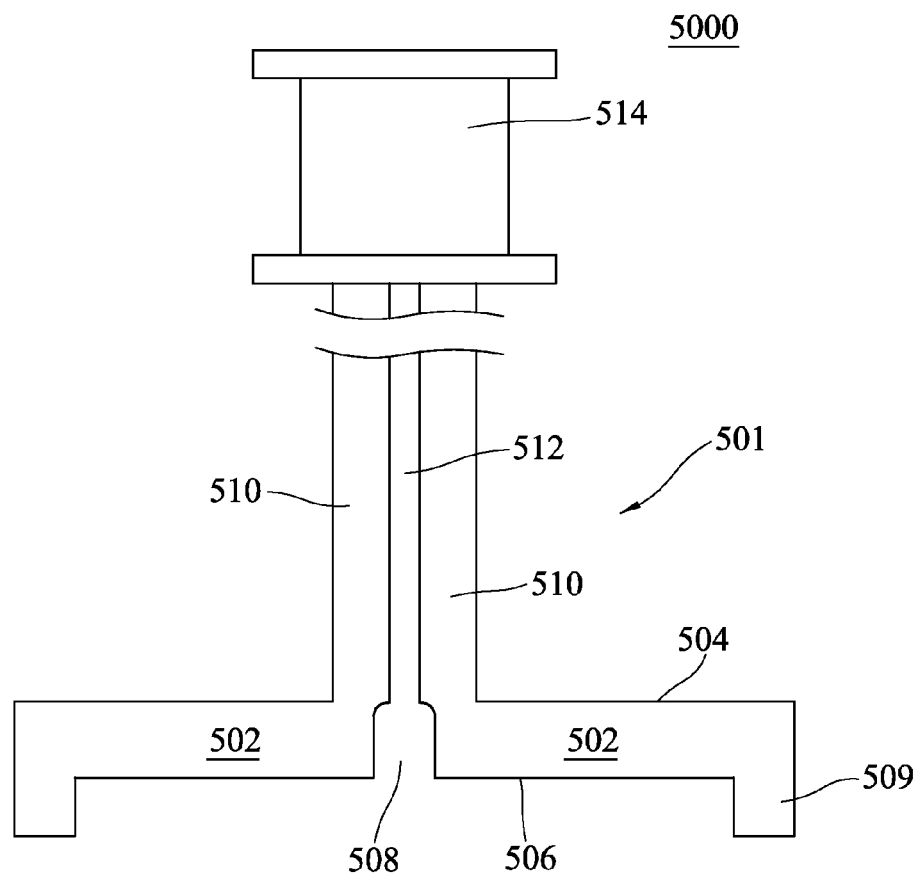
FIGS. 5A~5D are cross-sectional views of an exemplary embodiment 4 of a method for separating for separating a cap layer from a chip package according to the invention.
Figure 5A:

Referring to FIG. 5A, a separation apparatus 5000 in accordance with exemplary embodiment 4 of the present invention is provided. The separation apparatus 5000 comprises a vacuum nozzle head 501 including a suction pad 502 having a top surface 504 and a bottom surface 506, a through hole 508 penetrating the top surface 504 and the bottom surface 506 of the suction pad 502, an edge frame 509 surrounding the bottom surface 506 of the suction pad 502 and a hollow vacuum pipe 510 having an airway 512 connecting to the through hole 508 to a vacuum pump (not shown); a stage 516 positing under the vacuum nozzle head 501 and substantially aligning with the suction pad 502; and a control means 514 coupling to the vacuum nozzle head 501 to lift upward or lower down the vacuum nozzle head 501.

Figure 5B:
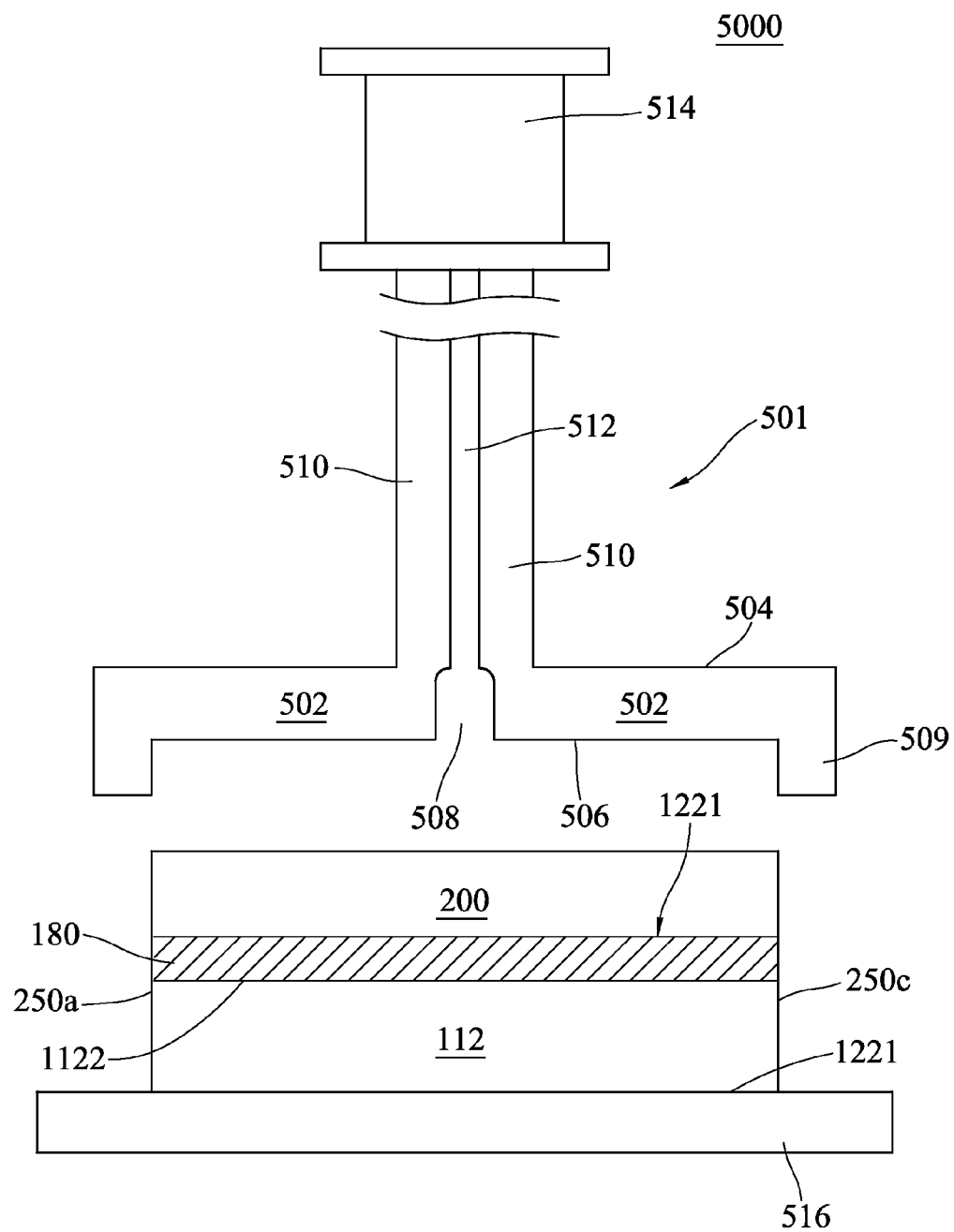
Figure 5C:
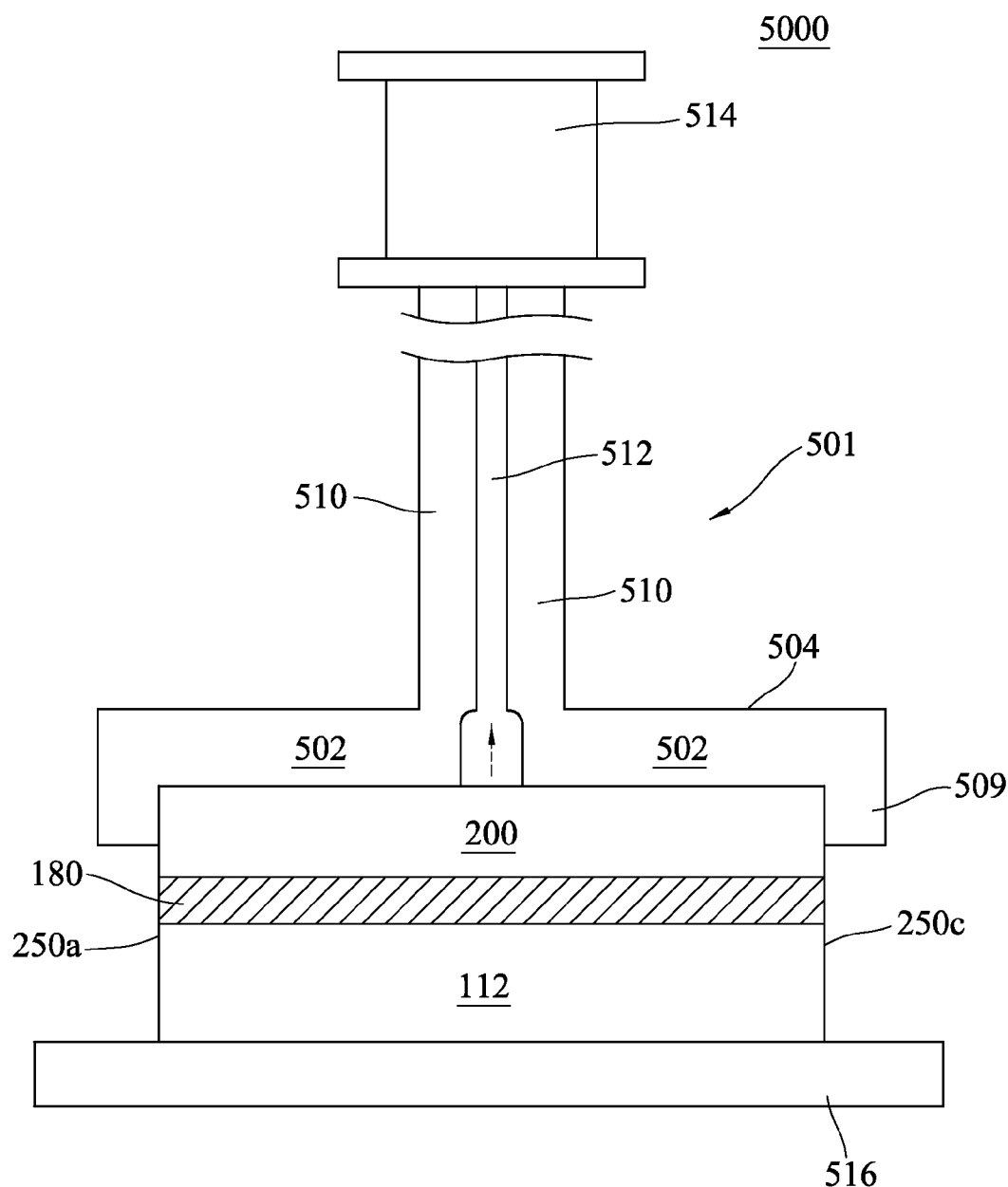

Next, referring to FIGS. 5B and 5C, a chip package 1000 as shown in FIG. 1B is provided and placed on the stage 516 through the second surface 1221. Then the fourth surface 1222 of the cap layer 200 is pressed against by the bottom surface 506 of the suction pad 502 and the first sidewall 250a, the second sidewall 250b, the third sidewall 250c and the fourth sidewall 250d are press against by the edge frame 509 by operating the control means 514 to lower down the vacuum nozzle head 501. Then cap layer 200 is sucked by the suction pad 502 of the vacuum nozzle head 501 after the vacuum pump begins to vacuum the air within the hollow airway 512 and the through hole 508 to achieve a vacuum degree Pi equal to or smaller than −90 Kpa.

Figure 5D:
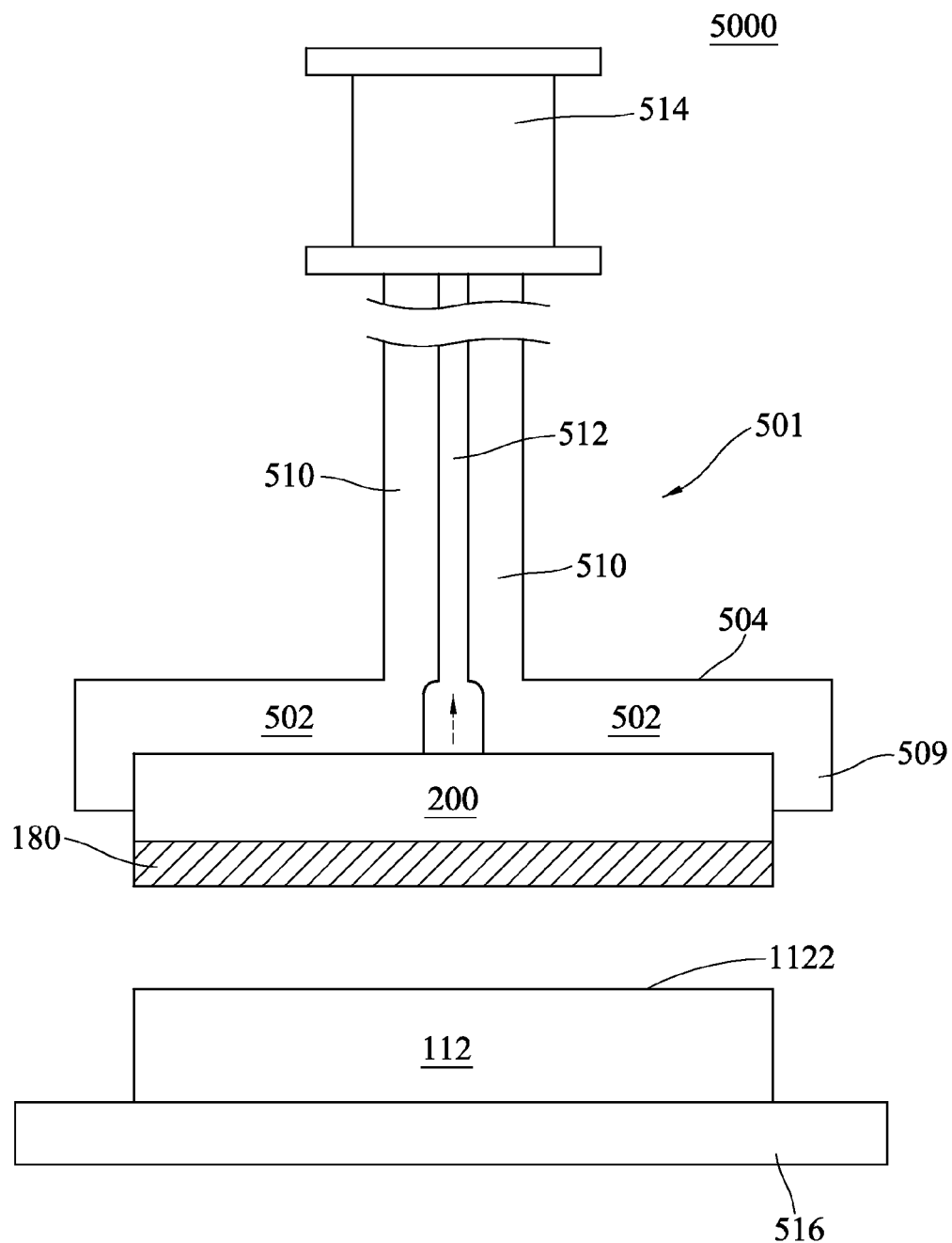

Finally, Referring to FIG. 5D, the vacuum nozzle head 501 is screwed at a speed of 300-700 degrees/second for a period of time less than 5 seconds to generate a torque force and lift upward the vacuum nozzle head to generate a lift force by the control means to separate the cap layer 200 and the adhesion layer 180 from the substrate 112 of the chip package 1000.

In one embodiment, the chip package 1000 is pre-treated with light exposure and/or heating before separated by the separation apparatus 501 to facilitate the separation of the cap layer 200 and the adhesion 180 from the substrate 112 when the adhesion layer 180 comprises a light sensitive resin such as UV glue. The pre-treatment of light exposure is proceed by irradiate the chip package 1000 by irradiated with UV light having a wavelength of 254 nm, and the pre-treatment of heating is proceeded at a temperature ranging from 25 degree C. to 60 degree C.

Exemplary Embodiment 5:

FIGS. 6A~6D illustrate another separation apparatus 6000 and steps for separation a cap layer from a chip package as shown in FIG. 1C or 1D by means of this separation apparatus in accordance with exemplary embodiment 5 of the present invention. The cross-section view of the chip package shown in FIG. 1B is used to represent cross-section views of the chip packages with different substrate structures as shown in FIGS. 1C and 1D to facilitate understanding the features of the present invention.

Figure 6A:
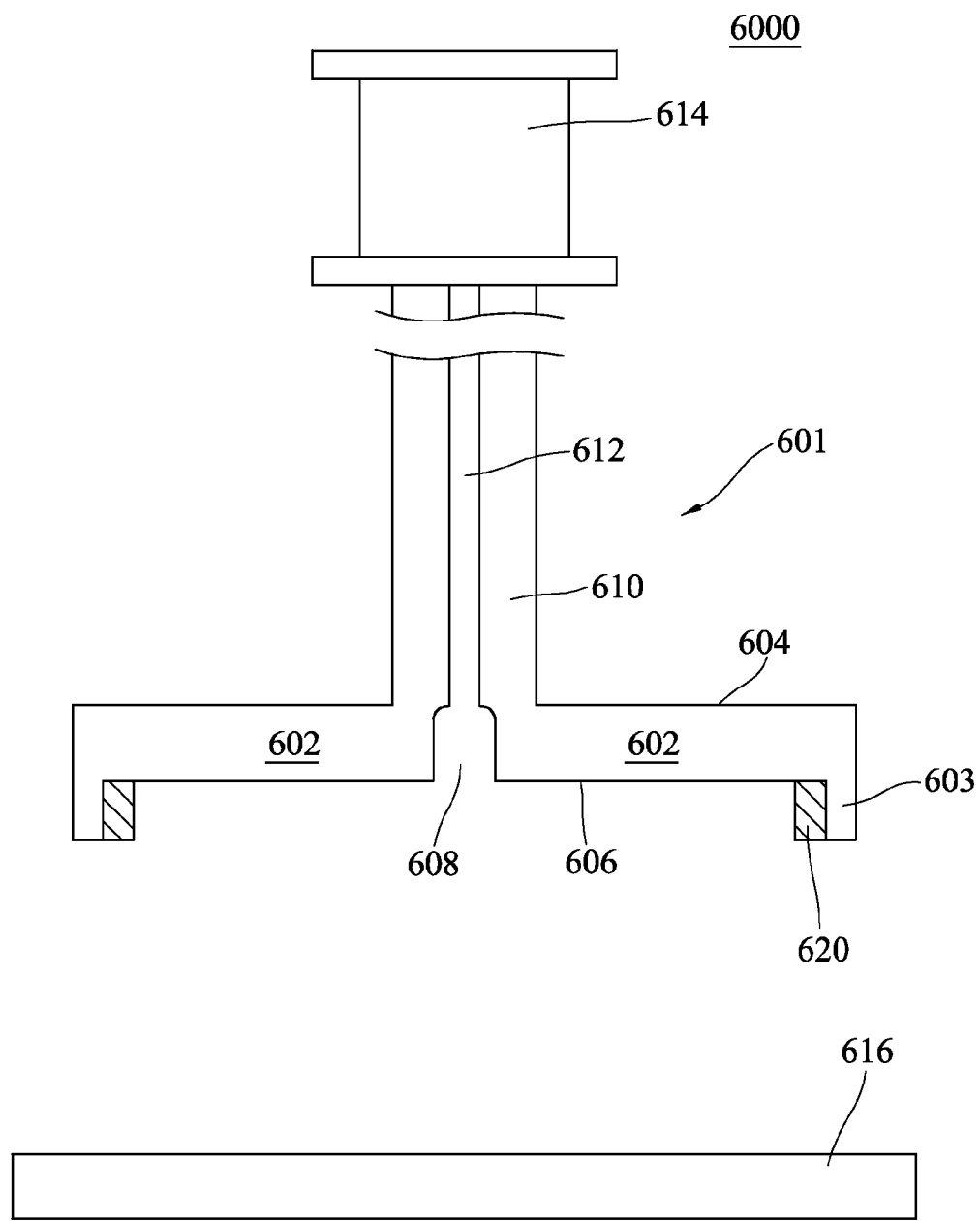
FIGS. 6A~6D are cross-sectional views of an exemplary embodiment 5 of a method for separating for separating a cap layer from a chip package according to the invention.

Referring to FIG. 6A, a separation apparatus 6000 in accordance with exemplary embodiment 5 of the present invention is provided. The separation apparatus 6000 comprises a vacuum nozzle head 601 including a suction pad 602 having a top surface 604 and a bottom surface 606, a through hole 608 penetrating the top surface 604 and the bottom surface 606 of the suction pad 602, an edge frame 609 surrounding the bottom surface 606 of the suction pad 602, a sealing ring 620 such as O-ring surrounding the inner wall of the edge frame 609, and a hollow vacuum pipe 610 having an airway 612 connecting to the through hole 608 to a vacuum pump (not shown); a stage 616 positing under the vacuum nozzle head 60l and substantially aligning with the suction pad 602; and a control means 614 coupling to the vacuum nozzle head 601 to lift upward or lower down the vacuum nozzle head 601.

Figure 6B:
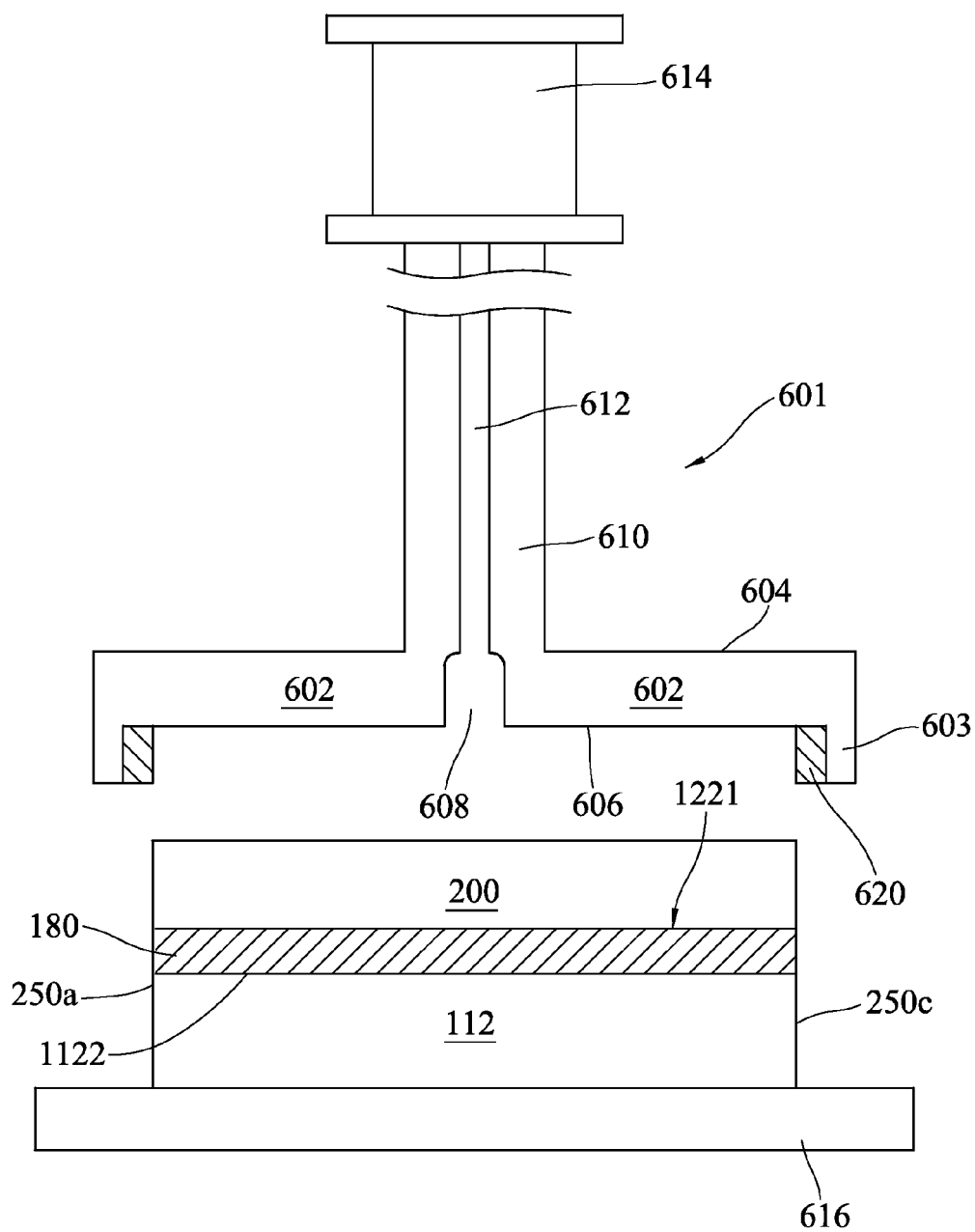
Figure 6C:
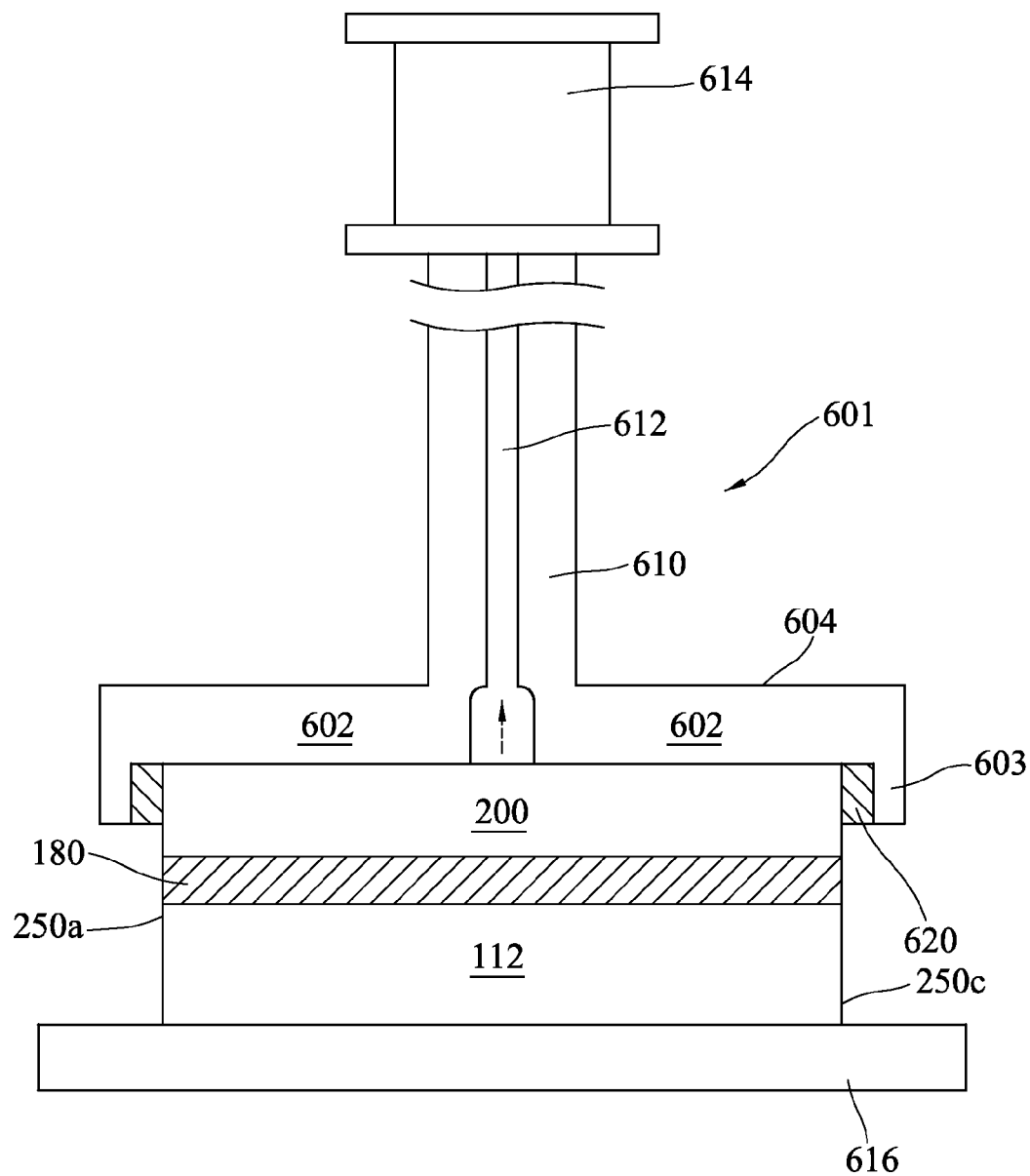

Next, referring to FIGS. 6B and 6C, a chip package 1000 as shown in FIG. 1B is provided and placed on the stage 616 through the second surface 1221. Then the fourth surface 1222 of the cap layer 200 is pressed against by the bottom surface 606 of the suction pad 602 and the first sidewall 250a, the second sidewall 250b, the third sidewall 250c and the fourth sidewall 250d are press against by the sealing ring 620 surrounding the inner wall of the edge frame 609 by operating the control means 614 to lower down the vacuum nozzle head 601. Then cap layer 200 is sucked by the suction pad 602 of the vacuum nozzle head 601 after the vacuum pump begins to vacuum the air within the hollow airway 612 and the through hole 608 to achieve a vacuum degree Pi equal to or smaller than −90 Kpa.

Figure 6D:
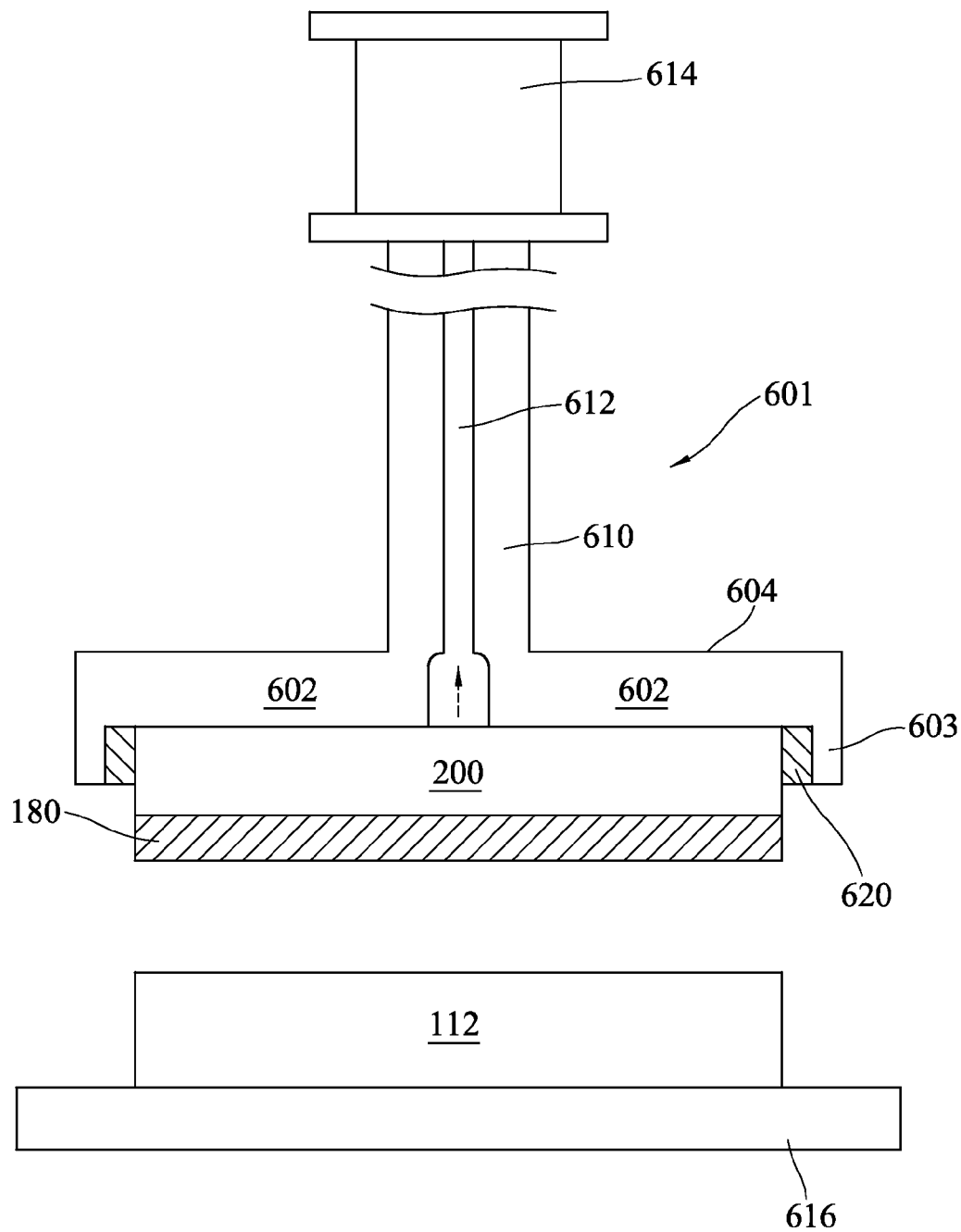

Finally, Referring to FIG. 6D, the vacuum nozzle head 601 is screwed at a speed of 300-700 degrees/second for a period of time less than 5 seconds to generate a torque force and lift upward the vacuum nozzle head to generate a lift force by the control means to separate the cap layer 200 and the adhesion layer 180 from the substrate 112 of the chip package 1000.

In one embodiment, the chip package 1000 is pre-treated with light exposure and/or heating before separated by the separation apparatus 501 to facilitate the separation of the cap layer 200 and the adhesion 180 from the substrate 112 when the adhesion layer 180 comprises a light sensitive resin such as UV glue. The pre-treatment of light exposure is proceed by irradiate the chip package 1000 by irradiated with UV light having a wavelength of 254 nm, and the pre-treatment of heating is proceeded at a temperature ranging from 25 degree C. to 60 degree C.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A separation apparatus for separating a stacked article comprising a substrate and a cap layer formed on the substrate, comprising:
   a vacuum nozzle head, comprising a suction pad having a top surface and a bottom surface, a through hole penetrating the top surface and the bottom surface of the suction pad, and a hollow vacuum pipe connecting the through hole to a vacuum pump;
   a stage, positioning under the vacuum nozzle head and substantially aligning with the suction pad;
   a control means, coupling to the vacuum nozzle head to lift upward or lower down the vacuum nozzle head; and
   a first cutter, comprising a first cutting body and a first knife connecting to the first cutting body;
   wherein, the cap layer is pressed by the bottom surface of the suction pad and the stacked article is sucked by the vacuum nozzle head after the vacuum pump begins to vacuum the air within the hollow vacuum pipe, then the first cutter cuts into the interface between the substrate and the cap layer, and the cap layer is separated from the substrate by the suction force of the vacuum nozzle head and the lift force generated by the upward movement of the vacuum nozzle head.

2. The separation apparatus as claimed in claim 1, the first cutter cuts into the interface between the substrate and the cap layer by moving toward a first sidewall of the stacked article.

3. The separation apparatus as claimed in claim 2, further comprising a second cutter having a second cutting body and a second knife connecting to the cutting body, wherein the second cutter cuts into the interface between the substrate and the cap layer by moving toward a second side opposite to the first of the stacked article.

4. The separation apparatus as claimed in claim 1, the suction pad further comprises an edge frame surrounding the edge of the bottom surface of the suction pad to closely press against part of the first and the second sidewalls.

5. The separation apparatus as claimed in claim 4, the edge frame further comprising a first slit facing the first side and a second slit facing the second side to expose the interface for the first knife and the second knife to pass through and cut into the interface.

6. A separation apparatus for separating a stacked article comprising a substrate and a cap layer formed on the substrate, comprising:
- a vacuum nozzle head, comprising a suction pad having a top surface and a bottom surface, an edge frame surrounding the edge of the bottom surface, a through hole penetrating the top surface and the bottom surface of the suction pad, and a hollow vacuum pipe connecting the through hole to a vacuum pump;
- a stage, positioning under the vacuum nozzle head and substantially aligning with the suction pad; and
- a control means, coupling to the vacuum nozzle head to screw and lift upward or lower down the vacuum nozzle head;
- wherein, the cap layer is pressed against by the bottom surface of the suction pad and the stacked article is sucked by the vacuum nozzle head after the vacuum pump begins to vacuum the air within the hollow vacuum pipe, the cap layer is separated from the substrate by the torque force generated by the screw of the vacuum nozzle head and the lift force generated by the upward movement of the vacuum nozzle head.

7. The separation apparatus as claimed in claim 6, further comprising a seal ring surrounding the inner wall of the edge frame.

8. A method for separating a cap layer from a substrate of a chip package, comprising:
- providing a separation apparatus for separating the cap layer from the substrate in a stacked structure of the chip package, comprising:
  - a vacuum nozzle head, comprising a suction pad having a top surface and a bottom surface, a through hole penetrating the top surface and the bottom surface of the suction pad, and a hollow vacuum pipe connecting the through hole to a vacuum pump;
  - a stage, positioning under the vacuum nozzle head and substantially aligning with the suction pad;
  - a control means, coupling to the vacuum nozzle head to lift upward or lower down the vacuum nozzle head; and
  - a first cutter, comprising a first cutting body and a first knife connecting to the first cutting body;
- providing a chip package on the stage, the chip package comprising:
  - the substrate, comprising a first surface, a second surface opposite to the first surface, a sensing device adjacent to the first surface, and a wire which interconnects with the sensing device adjacent to the second surface;
  - the cap layer capped on the substrate in the stacked structure, comprising a third surface having a bonding region with a surface area equal to that of the first surface and a peripheral region surrounding the bonding region and a fourth surface opposite to the third surface, and the cap layer capped on the first surface of the substrate through the bonding region of the third surface;
  - an adhesion layer sandwiched between the substrate and the cap layer and overlying the sensing device, wherein the adhesion layer is an interface between the substrate and the cap layer;
- wherein the chip package further comprising a first sidewall, a second sidewall, a third sidewall and a fourth sidewall defined by the edges of the cap layer, the adhesion layer and the substrate, and the first sidewall opposites to the second sidewall, and the third sidewall opposites to the fourth sidewall;
- lowering down the vacuum nozzle head to press against the fourth surface of the cap layer by the bottom surface of the suction pad;
- vacuuming the air within the hollow vacuum pipe to suck the stacked structure by the vacuum nozzle head;
- moving the first cutter toward the first sidewall of the chip package to make the first cutter cut into the interface between the substrate and the cap layer, including the adhesion layer along the third surface of the peripheral region near the first sidewall; and
- operating the control means to lift upward the vacuum nozzle head, wherein the cap layer and the adhesion layer are separated from the substrate by the suction force of the vacuum nozzle head and the lift force generated by the upward movement of the vacuum nozzle head.

9. The method as claimed in claim 8, further comprising a second cutter, comprising a second cutter having a second cutting body and a second knife connecting to the cutting body, wherein the second cutter is moved toward the second sidewall of the chip package to make the second knife cut into the adhesion layer along the third surface of another peripheral region near the second sidewall.

10. The method as claimed in claim 9, the suction pad further comprising an edge frame surrounding the edge of the bottom surface of the suction pad to closely press against part of the first, the second, the third and the fourth sidewalls.

11. The method as claimed in claim 10, further comprising:
- a first slit facing the first sidewall for the first knife to pass through and more precisely cut into the adhesion layer along the third surface of the peripheral region near the first sidewall; and
- a second slit facing the second sidewall for the second knife to pass through and more precisely cut into the adhesion layer along the third surface of the peripheral region near the second sidewall.

12. The method as claimed in claim 8, further comprising a print circuit board adjoined to the second surface of the substrate.

13. The method as claimed in claim 8, wherein the sensing device comprises an environmental sensor and/or a biometric features recognition sensor and/or a touch sensor.

14. The method as claimed in claim 13, the adhesion comprising a light sensitive material.

15. The method as claimed in claim 14, the chip package is pre-treated with light exposure and/or heating before separated by the separation apparatus.

16. The method as claimed in claim 13, wherein the chip package is manufactured by a process comprises:
- providing a base layer, having a first surface with a plurality of device regions and a second surface opposite to the first surface;
- forming a plurality of sensing devices adjacent to the first surface, and each device region comprising a sensing device;

forming an adhesion layer on the first surface and overlying the sending devices;
providing a cap layer, having a third surface and a fourth surface opposite to the third surface, and adjoined third surface of the cap layer to the first surface of the base layer to formed a stacked semiconductor;
flipping the stack semiconductor upside down and attaching to a carrier plate by the fourth surface;
forming a plurality of isolation trenches by removing partial of the base layer and the adhesion layer near the boundary of adjacent device regions; and
cleaving along the isolation trenches to generate a plurality of independent chip packages.

17. The method as claimed in claim 16, further comprising a plurality of conductive pads adjacent the first surface, and each device region comprising at least two of the conductive pads spaced from each other.

18. The method as claimed in claim 17, further comprising a wiring process before the flipping step, comprising:
forming a plurality of first openings exposed the conductive pads adjacent the second surface;
forming an insulating layer conformably overlying the second surface and the first openings, and the insulating layer having a plurality of via holes exposing the surface of each conductive pads;
forming a re-distribution layer (RDL) having a plurality wires filled in the first openings on the insulating layer, wherein each of the wires interconnecting each of the conductive pads through each of the via holes;
forming a passivation layer on the wiring layer, and the passivation layer having a plurality of second openings exposed the wires; and
forming a plurality of contact pads on each of the opening exposed the wires.

19. A method for separating a cap layer from a substrate of a chip package, comprising:
providing a separation apparatus for separating the cap layer from the substrate in a stacked structure of the chip package, comprising:
a vacuum nozzle head, comprising a suction pad having a top surface and a bottom surface, a through hole penetrating the top surface and the bottom surface of the suction pad, and a hollow vacuum pipe connecting the through hole to a vacuum pump;
a stage, positioning under the vacuum nozzle head and substantially aligning with the suction pad;
a control means, coupling to the vacuum nozzle head to lift upward or lower down the vacuum nozzle head; and
a first cutter, comprising a first cutting body and a first knife connecting to the first cutting body;
providing a chip package on the stage, the chip package comprising:
the substrate, comprising a first surface, a second surface opposite to the first surface, a sensing device adjacent to the first surface, and a wire which interconnects with the sensing device adjacent to the second surface;
the cap layer capped on the substrate in the stacked structure, comprising a third surface and a fourth surface opposite to each other, and the cap layer capped on the first surface of the substrate through the third surface;
an adhesion layer sandwiched between the substrate and the cap layer and overlying the sensing device, wherein the adhesion layer is an interface between the substrate and the cap layer;
wherein the chip package further comprising a first sidewall, a second sidewall, a third sidewall and a fourth sidewall defined by the edges of the cap layer, the adhesion layer and the substrate, and the first sidewall opposites to the second sidewall, and the third sidewall opposites to the fourth sidewall;
lowering down the vacuum nozzle head to press against the fourth surface of the cap layer by the bottom surface of the suction pad;
vacuuming the air within the hollow vacuum pipe to suck the stacked structure by the vacuum nozzle head;
moving the first cutter toward the first sidewall of the chip package to make the first cutter cut into the interface between the substrate and the cap layer, including the adhesion layer along the third surface of the cap layer near the first sidewall; and
operating the control means to lift upward the vacuum nozzle head, wherein the cap layer and the adhesion layer are separated from the substrate by the suction force of the vacuum nozzle head and the lift force generated by the upward movement of the vacuum nozzle head.

20. The method as claimed in claim 19, further comprising a second cutter, comprising a second cutter having a second cutting body and a second knife connecting to the cutting body, wherein the second cutter is moved toward the second sidewall of the chip package to make the second knife cut into the adhesion layer along the third surface of the substrate near the second sidewall.

21. The method as claimed in claim 20, the suction pad further comprising an edge frame surrounding the edge of the bottom surface of the suction pad to closely press against part of the first, the second, the third and the fourth sidewalls.

22. The method as claimed in claim 21, further comprising:
a first slit facing the first sidewall for the first knife to pass through and cut into the adhesion layer along the third surface of the peripheral region near the first sidewall; and
a second slit facing the second sidewall for the second knife to pass through and cut into the adhesion layer along the third surface of the peripheral region near the second sidewall.

23. The method as claimed in claim 19, further comprising a print circuit board adjoined to the second surface of the substrate.

24. The method as claimed in claim 19, wherein the sensing device comprises an environmental sensor and/or a biometric features recognition sensor and/or a touch sensor.

25. The method as claimed in claim 24, the adhesion comprising a light sensitive material.

26. The method as claimed in claim 25, the chip package is pre-treated with light exposure and/or heating before separated by the separation apparatus.

27. A method for separating a cap layer from a substrate of a chip package, comprising:
providing a separation apparatus for separating the cap layer from the substrate in a stacked structure of the chip package, comprising:
a vacuum nozzle head, comprising a suction pad having a top surface and a bottom surface, an edge frame surrounding the edge of the bottom surface, a through hole penetrating the top surface and the bottom surface of the suction pad, and a hollow vacuum pipe connecting the through hole to a vacuum pump;

a stage, positioning under the vacuum nozzle head and substantially aligning with the suction pad;

a control means, coupling to the vacuum nozzle head to screw and lift upward or lower down the vacuum nozzle head;

providing a chip package on the stage, the chip package comprising:

the substrate, comprising a first surface, a second surface opposite to the first surface, a sensing device adjacent to the first surface, and a wire which interconnects with the sensing device adjacent to the second surface;

the cap layer capped on the substrate in the stacked structure, comprising a third surface and a fourth surface opposite to each other, and the cap layer capped on the first surface of the substrate through the third surface;

an adhesion layer sandwiched between the substrate and the cap layer and overlying the sensing device;

operating the control means to lower down the vacuum nozzle head to press against the fourth surface of the cap layer by the bottom surface of the suction pad and press against the sidewall of the cap layer;

vacuuming the air within the hollow vacuum pipe to achieve a vacuum degree Pi equal to or smaller than −90 Kpa to suck the stacked structure by the vacuum nozzle head; and operating the control means to screw the vacuum nozzle head at a speed of 300-700 degrees/second for a period of time less than 5 seconds to generate a torque force and lift upward the vacuum nozzle head to generate a lift force, wherein the cap layer and the adhesion layer is separated from the substrate by the torque force generated by the screw of the vacuum nozzle head and the lift force generated by the upward movement of the vacuum nozzle head.

28. The method as claim 27, further comprising a seal ring surrounding the inner wall of the edge frame.

29. The method as claimed in claim 28, the adhesion comprising a light sensitive material.

30. The method as claimed in claim 29, the chip package is pre-treated with light exposure and/or heating before separated by the separation apparatus.

* * * * *